United States Patent
Eichler et al.

(10) Patent No.: US 10,833,475 B2
(45) Date of Patent: Nov. 10, 2020

(54) OPTOELECTRONIC LIGHTING DEVICE, CARRIER FOR AN OPTOELECTRONIC SEMICONDUCTOR CHIP, AND OPTOELECTRONIC LIGHTING SYSTEM

(71) Applicant: OSRAM OLED GmbH, Regensburg (DE)

(72) Inventors: Christoph Eichler, Donaustauf (DE); Sven Gerhard, Alteglofsheim (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/081,881

(22) PCT Filed: Mar. 3, 2017

(86) PCT No.: PCT/EP2017/055008
§ 371 (c)(1),
(2) Date: Aug. 31, 2018

(87) PCT Pub. No.: WO2017/149121
PCT Pub. Date: Sep. 8, 2017

(65) Prior Publication Data
US 2019/0089125 A1    Mar. 21, 2019

(30) Foreign Application Priority Data
Mar. 3, 2016 (DE) ........................ 10 2016 103 862

(51) Int. Cl.
*H01S 5/022* (2006.01)
*H01L 33/48* (2010.01)
(Continued)

(52) U.S. Cl.
CPC .......... *H01S 5/02272* (2013.01); *H01L 33/20* (2013.01); *H01L 33/44* (2013.01);
(Continued)

(58) Field of Classification Search
CPC ............. H01S 5/02256; H01S 5/02272; H01S 5/02469; H01S 5/028; H01S 5/1003;
(Continued)

(56) References Cited

U.S. PATENT DOCUMENTS 3,644,800 A    2/1972  Igarashi
5,305,340 A    4/1994  Antreasyan et al.
(Continued)

FOREIGN PATENT DOCUMENTS

DE           2 038 122 A    2/1971
DE    10 2007 053 849 A1   4/2009
(Continued)

OTHER PUBLICATIONS

German Search Report dated Jan. 11, 2017, of corresponding German Application No. 10 2016 103 862.8.

*Primary Examiner* — Armando Rodriguez
(74) *Attorney, Agent, or Firm* — DLA Piper LLP (US)

(57) ABSTRACT

An optoelectronic lighting device includes an optoelectronic semiconductor chip including a top side and an underside opposite the top side, wherein a semiconductor layer sequence is formed between the top side and the underside, the semiconductor layer sequence includes an active zone that generates electromagnetic radiation, and a barrier for a bonding material flowing on account of cohesive bonding of the semiconductor chip to a carrier is formed at one of the top side and the underside.

17 Claims, 30 Drawing Sheets

(51) Int. Cl.
*H01L 33/20* (2010.01)
*H01L 33/44* (2010.01)
*H01L 33/62* (2010.01)
*H01L 33/64* (2010.01)
*H01S 5/024* (2006.01)
*H01S 5/028* (2006.01)
*H01S 5/10* (2006.01)
*H01S 5/22* (2006.01)
*H01S 5/40* (2006.01)

(52) U.S. Cl.
CPC ............ *H01L 33/483* (2013.01); *H01L 33/62* (2013.01); *H01L 33/647* (2013.01); *H01S 5/028* (2013.01); *H01S 5/02469* (2013.01); *H01S 5/1003* (2013.01); *H01S 5/22* (2013.01); *H01S 5/4025* (2013.01); *H01L 2933/0025* (2013.01); *H01L 2933/0066* (2013.01); *H01L 2933/0075* (2013.01); *H01S 2301/176* (2013.01)

(58) Field of Classification Search
CPC . H01S 5/22; H01S 5/4025; H01S 5/20; H01S 5/44; H01S 5/62; H01S 5/647; H01S 5/0025; H01S 5/0066; H01S 5/0075; H01S 5/176; H01L 33/20; H01L 33/44; H01L 33/62; H01L 33/647; H01L 2933/0025; H01L 2933/0066; H01L 2933/0075; H01L 2933/176
See application file for complete search history.

(56) References Cited

U.S. PATENT DOCUMENTS

| | | | | |
|---|---|---|---|---|
| 6,075,800 | A | * | 6/2000 | Spear .................. H01S 5/02272 257/777 |
| 2005/0232324 | A1 | * | 10/2005 | Terada ...................... H01S 5/22 372/46.01 |
| 2010/0214727 | A1 | | 8/2010 | Eissler |
| 2013/0256862 | A1 | | 10/2013 | Zeiler et al. |
| 2016/0163932 | A1 | | 6/2016 | Brandl et al. |
| 2017/0054110 | A1 | | 2/2017 | Racz et al. |
| 2017/0162749 | A1 | | 6/2017 | Schmid et al. |

FOREIGN PATENT DOCUMENTS

| | | |
|---|---|---|
| DE | 10 2009 005 709 A1 | 7/2010 |
| DE | 10 2010 027 313 A1 | 1/2012 |
| DE | 10 2013 212 928 A1 | 1/2015 |
| DE | 10 2014 107 385 A1 | 11/2015 |
| WO | 2015/166022 A1 | 11/2015 |

\* cited by examiner

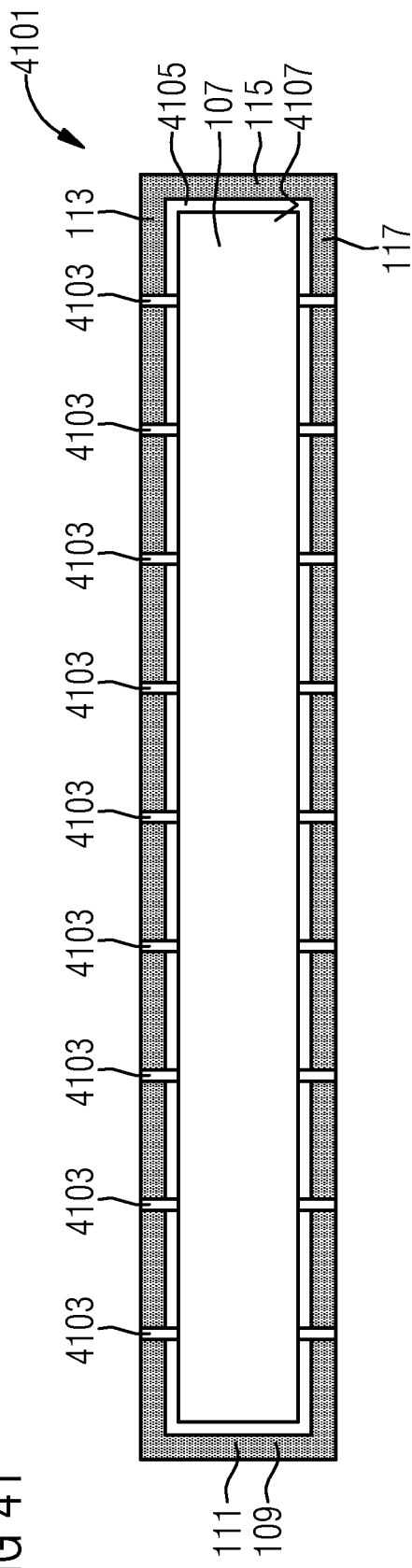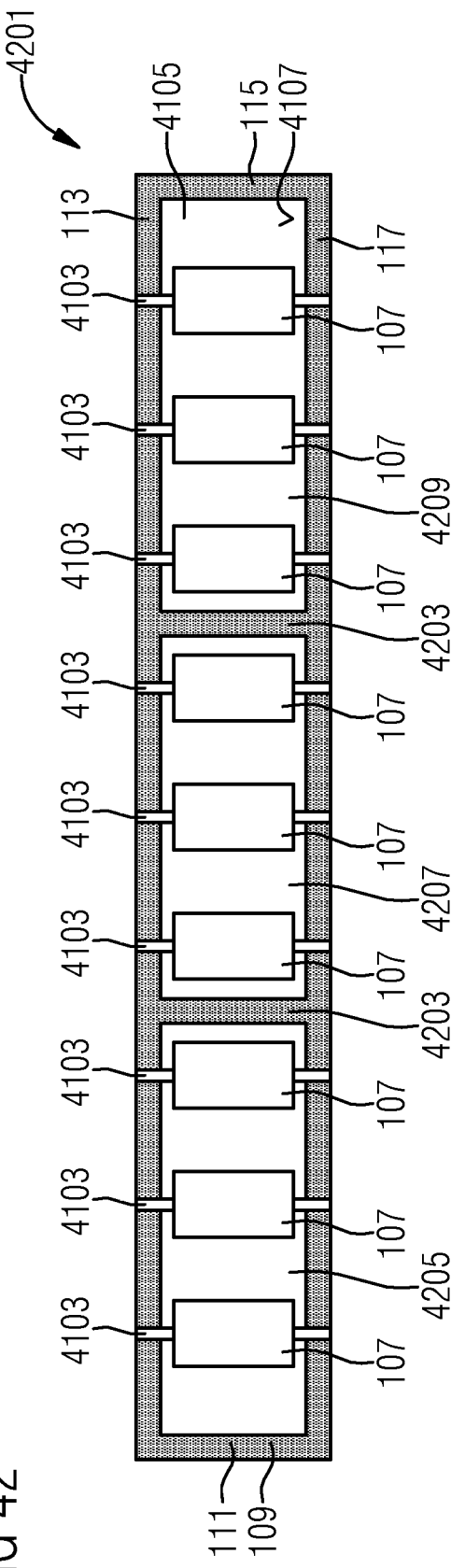

OPTOELECTRONIC LIGHTING DEVICE, CARRIER FOR AN OPTOELECTRONIC SEMICONDUCTOR CHIP, AND OPTOELECTRONIC LIGHTING SYSTEM

TECHNICAL FIELD

This disclosure relates to an optoelectronic lighting device, a method of producing an optoelectronic lighting device, a carrier for an optoelectronic semiconductor chip, and a method of producing a carrier for an optoelectronic semiconductor chip. The disclosure furthermore relates to an optoelectronic lighting system.

BACKGROUND

Optoelectronic semiconductor chips are known, for example, from DE 10 2014 107 385 A1.

In general, optoelectronic semiconductor chips are soldered onto a carrier. During soldering it may happen that liquid solder flows or creeps up at a semiconductor chip side face and then short-circuits a p-n junction, for example.

This analogously applies to when an optoelectronic semiconductor chip is adhesively bonded onto a carrier. There, too, during adhesive bonding, adhesive may flow or creep up at a semiconductor chip side face and then, for example, if the adhesive is electrically conductive, short-circuit a p-n junction.

It could therefore be helpful to provide an efficient means to efficiently cohesively bond an optoelectronic semiconductor chip to a carrier.

SUMMARY

We provide an optoelectronic lighting device including an optoelectronic semiconductor chip including a top side and an underside opposite the top side, wherein a semiconductor layer sequence is formed between the top side and the underside, the semiconductor layer sequence includes an active zone that generates electromagnetic radiation, and a barrier for a bonding material flowing on account of cohesive bonding of the semiconductor chip to a carrier is formed at one of the top side and the underside.

We also provide a method of producing an optoelectronic lighting device including providing an optoelectronic semiconductor chip including a top side and an underside opposite the top side, wherein a semiconductor layer sequence is formed between the top side and the underside, and the semiconductor layer sequence includes an active zone that generates electromagnetic radiation, and forming at one of the top side and the underside a barrier for a bonding material flowing on account of cohesive bonding of the semiconductor chip to a carrier.

We further provide a carrier for an optoelectronic semiconductor chip including a main body including a mounting side, wherein a barrier for a bonding material flowing on account of cohesive bonding of the semiconductor chip to the carrier is formed at the mounting side.

BRIEF DESCRIPTION OF THE DRAWINGS

FIG. 41 shows an optoelectronic lighting device.
FIG. 42 shows an optoelectronic lighting device.

LIST OF REFERENCE SIGNS

Figure 1:
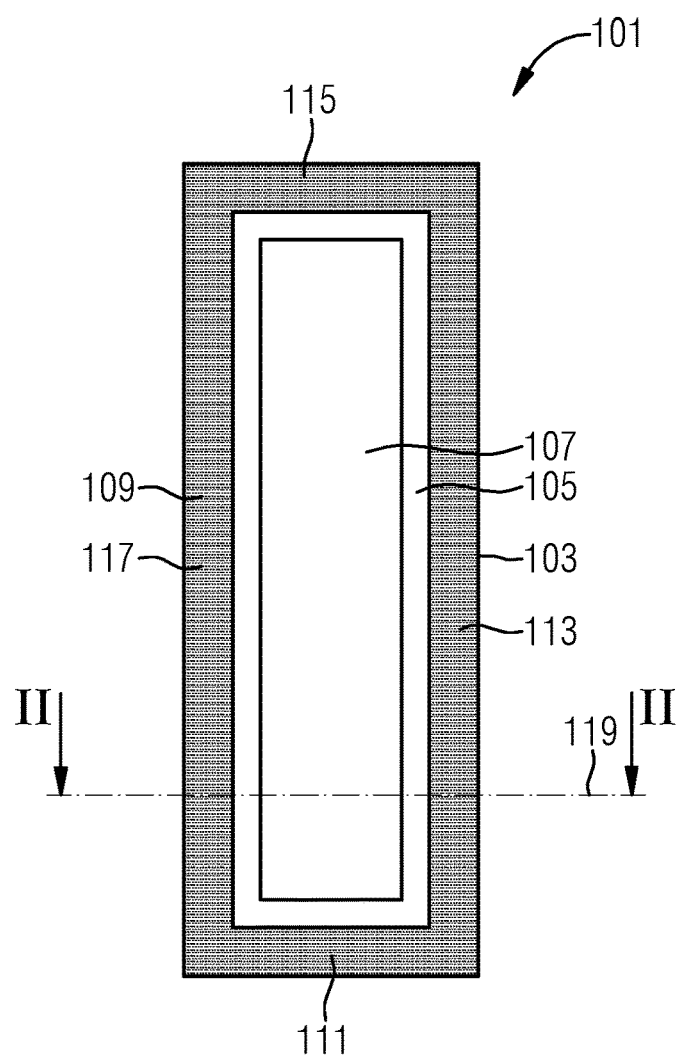
FIG. 1 shows an optoelectronic lighting device.

101 Optoelectronic lighting device
103 Optoelectronic semiconductor chip

105 Top side of the optoelectronic semiconductor chip
107 Solder
109 Solder barrier
111, 113, 115, 117 Walls of the solder barrier
119 Sectional line
201 Underside of the optoelectronic semiconductor chip
203, 205, 207 Semiconductor layers
209 Semiconductor layer sequence
211 Active zone
213 Semiconductor chip edge
215 Substrate
301 Carrier
303 Main body
305 Mounting side
401 Optoelectronic lighting system
403, 405 Sidewalls of the semiconductor chip
501 Optoelectronic lighting device
701 Cover layer comprising gold
703 SiO$_2$ layer
705 Surface of the cover layer comprising gold
801 Optoelectronic lighting device
803 Removed SiO$_2$ layer sections
1201 Optoelectronic lighting device
1203 Optoelectronic lighting system
1301 Ridge waveguide
1303, 1305 Left lateral walls of the semiconductor layer sequence
1307 Passivation layer
1401 Optoelectronic lighting device
1403, 1405 Elevations
1501 Optoelectronic lighting device
1503 Wetting layer
1601 Optoelectronic lighting device
1801 Optoelectronic lighting system
1901 Optoelectronic lighting device
2001 Optoelectronic lighting device
2101 Optoelectronic lighting device
2201 Optoelectronic lighting device
2203 Gap
2205 Wall
2301 Optoelectronic lighting system
2401 Optoelectronic lighting device
2403, 2405 Mesa trenches
2501 Optoelectronic lighting device
2503, 2505 Mesa trenches
2601 Optoelectronic lighting device
2603, 2605 Facets
2607 Facet section
2609 Intermediate section
2611 Sectional line
2613 Sectional line
2901 Optoelectronic lighting device
3101 Optoelectronic lighting system
3201 Optoelectronic lighting device
3401 Optoelectronic lighting device
3403 Wall
3405 First trough
3407 Second trough
3601 Optoelectronic lighting device
3603 Wall
3701 Optoelectronic lighting device
3801 Optoelectronic lighting device
3803 Wall
3805 Wall
3807 Wall
3809 p-type contact
3811 n-type contact
3901 Optoelectronic lighting device
4001 Optoelectronic lighting device
4101 Optoelectronic lighting device
4103 Laser
4105 Laser bar
4107 Underside of the laser bar
4201 Optoelectronic lighting device
4203 Wall
4205, 4207, 4209 Troughs
4301 Optoelectronic lighting device
4401 Optoelectronic lighting system
4501 Optoelectronic lighting system
4503 Optoelectronic lighting device
4601 Optoelectronic lighting system
4603 Optoelectronic lighting device
4701 Carrier
4703 Main body
4705 Mounting surface
4707, 4709 Stops
4801 Optoelectronic lighting system
4901 Carrier
4903 Main body
4905 Mounting side
4907, 4909 Depressions
5001 Optoelectronic lighting system
5101 Providing an optoelectronic semiconductor chip
5103 Forming a solder barrier
5201 Providing a main body
5203 Forming a solder barrier
5301 Optoelectronic lighting device
5401 Optoelectronic lighting system

DETAILED DESCRIPTION

Our optoelectronic lighting device comprises:

an optoelectronic semiconductor chip, which comprises a top side and an underside opposite the top side, wherein a semiconductor layer sequence is formed between the top side and the underside, wherein the semiconductor layer sequence comprises an active zone that generates electromagnetic radiation, and wherein a barrier for a bonding material flowing on account of cohesive bonding of the semiconductor chip to a carrier is formed at one of the top side and the underside.

Our method of producing an optoelectronic lighting device comprises:

providing an optoelectronic semiconductor chip, which comprises a top side and an underside opposite the top side, wherein a semiconductor layer sequence is formed between the top side and the underside, wherein the semiconductor layer sequence comprises an active zone that generates electromagnetic radiation, and forming at one of the top side and the underside a barrier for a bonding material flowing on account of cohesive bonding of the semiconductor chip to a carrier.

Our carrier for an optoelectronic semiconductor chip comprises:

a main body comprising a mounting side, wherein a barrier for a bonding material flowing on account of cohesive bonding of the semiconductor chip to the carrier is formed at the mounting side.

Our method of producing a carrier for an optoelectronic semiconductor chip comprises:

providing a main body comprising a mounting side, and forming a barrier at the mounting side of the main body for a bonding material flowing on account of cohesive bonding of the semiconductor chip to the carrier.

Our optoelectronic lighting system comprises:

an optoelectronic lighting device, wherein the lighting device comprises an optoelectronic conductor chip, which comprises a top side and an underside opposite the top side, wherein a semiconductor layer sequence is formed between the top side and the underside, wherein the semiconductor layer sequence comprises an active zone that generates electromagnetic radiation, and a carrier, which comprises a main body comprising a mounting side, wherein the lighting device is configured in accordance with the lighting device, and/or wherein the carrier is configured in accordance with the carrier, wherein the semiconductor chip is cohesively bonded by one of the top side and the underside to the mounting side by a bonding material.

This disclosure is based on our discovery that relates to providing a barrier for the flowing bonding material. The barrier acts like a dam. The barrier may also be referred to as a bonding material barrier.

The wording "one of the top side and the underside" used above and/or respectively below means in particular "the top side or the underside". The wording "at one of the top side and the underside" may thus in particular also be replaced by the wording "at the top side or at the underside". That is to say therefore that the barrier is formed, for example, at the top side or at the underside. The wording "by one of the top side and the underside" may thus in particular also be replaced by the wording "by the top side or by the underside".

The barrier forms in particular an elevation relative to the top side and/or respectively underside. Thus, relative to the top side and/or respectively underside, the barrier is configured as elevated with respect to the top side and/or respectively underside. Therefore, in particular one or a plurality of elevations, the barrier, is or are configured and/or respectively formed at the top side and/or respectively underside.

The bonding material may be a solder or comprises a solder. The barrier may then, for example, also be referred to as a solder barrier. The cohesive bonding thus comprises soldering or is soldering according to one example.

The bonding material may be an adhesive or comprises an adhesive. The adhesive is, for example, an electrically conductive adhesive. The barrier may then, for example, also be referred to as an adhesive barrier. The cohesive bonding thus comprises adhesive bonding or is adhesive bonding according to one example.

If the text hereinafter mentions a solder barrier and/or respectively a solder and/or respectively soldering, nevertheless the general case of the bonding material and the more specific case of the adhesive are always intended to be concomitantly inferred. That is to say that according to further examples as an alternative or in addition to a solder in the examples described below adhesive is respectively used.

The solder barrier thus forms a barrier that may also be referred to as a dam, for the solder flowing on account of the soldering of the semiconductor chip onto a carrier. The barrier thus acts like a dam.

This affords in particular the technical advantage that flowing out of the solder or generally of the bonding material below the side facing the mounting side (that is to say either the top side or the underside) of the optoelectronic semiconductor chip on account of the soldering, generally the cohesive bonding, may be reduced or even prevented. This therefore affords the technical advantage that an optoelectronic semiconductor chip may be efficiently soldered onto a carrier or generally efficiently bonded cohesively to a carrier.

In particular, a risk of a short circuit at a p-n junction on account of the solder flowing or creeping up may thus be reduced or even excluded. Furthermore, this may afford the technical advantage that shunts at the semiconductor chip edge may be avoided. In particular, yield may be increased as a result.

In addition, this affords the technical advantage, in particular, that a potential aging risk is eliminated since the shunts at the semiconductor chip edge may in some instances also only occur during operation of the semiconductor chip.

The solder barrier or generally the barrier in particular furthermore advantageously acts as a spacer in an efficient manner such that the semiconductor chip may not be placed arbitrarily closely on the carrier. That is to say that the solder barrier or barrier predefines a minimum distance between that side (top side or underside) of the semiconductor chip facing the mounting side and the mounting side. That is to say that the solder barrier or barrier automatically predefines a minimum required distance for arranging the semiconductor chip on the mounting side. As a result, therefore, a process window is enlarged in particular in an advantageous manner since the semiconductor chips may be soldered on (or generally pressed on during the cohesive bonding) with highly varying press-on pressure insofar as the solder barrier or barrier automatically predefines the minimum required distance. Excessively firm pressing-on furthermore does not result in liquid solder or liquid bonding material being pressed out below the top side and/or below the underside. This is because even in excessively firm pressing-on, the distance remains constant on account of the barrier acting as a spacer.

Furthermore, in particular a narrower production distribution of a thermal resistance arises as a result of the defined distance between semiconductor chip and carrier.

The wording "at one of the top side and the underside of the semiconductor chip" thus means in particular that the solder barrier is formed at the top side or at the underside.

The barrier, in particular the solder barrier may comprise one or a plurality of walls such that at least one, in particular a plurality of, at least partly, in particular completely, laterally closed trough(s) that receive the flowing bonding material, in particular the solder and/or the adhesive, is/are formed by the one or the plurality of walls and the one of the topside and the underside.

This affords the technical advantage, in particular, that the flowing bonding material may be efficiently received such that by this means it is possible efficiently to prevent a situation in which the flowing bonding material flows beyond the chip edge and flows or creeps up at side faces of the semiconductor chip and thus might possibly short-circuit a p-n junction.

The wording "at least partly laterally closed" encompasses in particular the fact that one or a plurality of troughs is/are completely laterally closed. That is to say that the plurality of walls or the one wall form(s) or shape(s) in each case one or a plurality of self-contained troughs.

Two troughs may be formed, wherein in each case an electrical contact that electrically contacts the semiconductor chip is arranged within the two troughs, wherein the two troughs are separated from one another by one or a plurality of closed walls to prevent formation of a shunt through the flowing bonding material between the two electrical contacts.

This affords the technical advantage, in particular, that it is possible to efficiently prevent a shunt from forming between the two electrical contacts on account of flowing bonding material. This is because, by virtue of the two troughs completely separated from one another, bonding material may no longer flow from one trough to the other and form a shunt.

The two electrical contactings are, for example, a p-type contact and an n-type contact.

The barrier, in particular the solder barrier may be formed at least partly, in particularly completely, by the semiconductor layer sequence.

This affords the technical advantage, in particular, that the barrier may be formed efficiently. In particular, it is provided that the barrier is concomitantly formed immediately during the process of forming the semiconductor layer sequence. By way of example, the semiconductor layer sequence is processed such that the processed semiconductor layer sequence at least partly integrally comprises a barrier. That is to say that the barrier has been and/or respectively is formed at least partly, in particular completely, by one or a plurality of semiconductor layers of the semiconductor layer sequence.

Bonding material, in particular solder and/or adhesive may be arranged at the one of the top side and the underside.

The bonding material, in particular solder and/or adhesive, provided with a cover layer comprising gold may be arranged at the one of the top side and the underside.

This affords the technical advantage, in particular, that oxidation of the bonding material, in particular of the solder and/or the adhesive, may be efficiently prevented by provision of the cover layer comprising gold. That is to say that the applied bonding material is protected by the cover layer comprising gold.

The cover layer comprises a gold alloy, for example.

The semiconductor chip may be a laser.

The laser may comprise a ridge waveguide. A ridge waveguide may also be referred to as a "ridge". The ridge waveguide is formed, for example, at the underside and/or respectively top side of the laser.

The barrier is formed, for example, at the same side as the ridge waveguide.

The barrier may be higher than the ridge waveguide. In other words the barrier projects above the ridge waveguide in particular. In other words the barrier is configured in a manner projecting above the ridge waveguide, in particular. In other words, for example, the ridge waveguide comprises a first height relative to the top side and/or respectively underside of the semiconductor chip. That is to say, for example, that the barrier comprises a second height relative to the top side and/or respectively underside of the semiconductor chip. The second height is in particular exclusively greater than the first height.

The semiconductor chip may be a laser, wherein the barrier is configured in an open fashion at the HR side of the laser.

This affords the technical advantage, in particular, that the bonding material may flow out preferably via the open side, that is to say via the HR side, and not via the AR side of the laser, which might possibly disturb an emission characteristic of the laser. "AR" stands for "antireflection" and is the laser's coupling-out facet embodied with relatively low reflectivity. "HR" stands for "high reflection" and is the highly reflective rear facet of the laser. In other words, the AR side is the coupling-out facet of the laser. In other words, the HR side of the laser is arranged opposite the coupling-out facet of the laser. In other words, the coupling-out facet is embodied in particular with less reflectivity than the HR side. That is to say in particular that the coupling-out facet reflects the laser radiation building up within the laser to a lesser extent than the HR side.

The barrier may be configured in a closed fashion at the AR side of the laser.

The barrier, in particular the solder barrier may comprise one or a plurality of gaps for the escape of air during the cohesive bonding, in particular during soldering and/or adhesive bonding.

This affords the technical advantage, in particular, that air may efficiently escape, in particular escape laterally, during cohesive bonding. Even a barrier comprising gaps nevertheless still efficiently prevents, as spacer, bonding material from being able to be forced out below the semiconductor chip inasmuch as the semiconductor chip without a barrier might be pressed onto the mounting surface with an excessively high press-on pressure, which might result in the liquid bonding material being forced out.

Even a barrier comprising gaps at least partly prevents the bonding material from flowing up. Such a barrier thus at least partly still acts as a dam.

Moreover, it is thereby advantageously possible for excess solder or generally excess bonding material to be led away at target locations configured in particular such that there is no risk of a short circuit. A corresponding advantage is, for example, that a solder thickness (bonding material thickness) and depth of the solder barrier (depth of the barrier) need not be exactly coordinated with one another, which is easier and/or less expensive to produce. When examples comprising a barrier comprising gaps are described below, nevertheless the corresponding advantages above are intended always to be concomitantly inferred.

The semiconductor chip may be a laser comprising a ridge waveguide, wherein the barrier, in particular the solder barrier, is formed at a distance from the ridge waveguide.

This affords the technical advantage, in particular, that the ridge waveguide is mechanically relieved of loading by the barrier, which advantageously results in a better aging stability of the laser.

One or a plurality of mesa trenches that receive the flowing bonding material, in particular the solder, may be formed at the one of the top side and the underside.

This affords the technical advantage, in particular, that a larger volume, the volume provided by the mesa trenches is made available for a bonding material outflow, in particular solder outflow.

The one or the plurality of mesa trenches may extend from a first facet of the semiconductor chip to a second facet opposite the first facet, wherein the one mesa trench comprises two facet sections each adjoining one of the two facets and an intermediate section extending between the two facet sections, wherein a depth of the intermediate section is greater than a respective depth of the two facet sections.

This affords the technical advantage, in particular, that relative to the facet sections more volume is available in the intermediate section for flowing bonding material such that bonding material, in particular solder and/or adhesive, may be prevented from creeping up and short circuits may thus be prevented.

In the facet sections a depth relative to the intermediate section is smaller such that an optimum quality was able to be ensured during facet cleavage.

The one or the plurality of mesa trenches have been etched and/or respectively may be etched.

A plurality of optoelectronic semiconductor chips configured as lasers and forming a laser bar may be provided, wherein respectively each of the one of the top side and the underside of the semiconductor chips form a common underside and/or respectively top side of the laser bar.

This affords the technical advantage, in particular, that the laser bar may be efficiently soldered onto a carrier.

A plurality of troughs may be formed at the common underside and/or respectively top side of the laser bar, in each case one or a plurality of lasers being arranged within the troughs.

This affords the technical advantage, in particular, that thermal crosstalk between the lasers may be influenced in a targeted manner depending on how many are arranged in a trough.

By way of example, in each case three lasers are arranged in a trough.

By way of example, all the lasers are arranged in a common trough.

A wetting layer, in particular a metallic wetting layer, may be provided and/or respectively formed. According to one example, such a wetting layer is applied or arranged on the one of the top side and the underside of the semiconductor chip. Such a wetting layer may be applied or arranged on the mounting surface.

Providing such a wetting layer affords the technical advantage, in particular, that an improved mechanical stability of a cohesive bond, in particular soldering bond and/or an adhesive bond, between the semiconductor chip and the carrier may be achieved.

Instead of or in addition to a wetting layer, a contact pad may be provided. The advantages arising in association with the wetting layer are analogously applicable to the contact pad.

The semiconductor chip may be a light emitting diode chip.

Forming the barrier, in particular solder barrier, may comprise forming one or a plurality of walls such that at least one at least partly laterally closed trough that receives the flowing bonding material is formed by the one or the plurality of walls and the one of the top side and the underside.

Two troughs may be formed, wherein in each case an electrical contact for electrically contacting the semiconductor chip is arranged within the two troughs, and wherein the two troughs are separated from one another by one or a plurality of closed walls to prevent formation of a shunt through flowing bonding material, in particular through flowing solder, between the two electrical contacts.

The barrier may be formed at least partly by the semiconductor layer sequence.

By way of example, the semiconductor layer sequence may have a ridge waveguide. That is to say that the semiconductor layer sequence is processed such that a ridge waveguide is formed. By way of example, in the context of processing the semiconductor layer sequence material is removed from the semiconductor layer sequence. Removing the material may be carried out such that the barrier is formed at least partly, in particular completely, at the same time as the ridge waveguide is formed. That is to say that material is removed from the semiconductor layer sequence to form the ridge waveguide. In the context of forming the ridge waveguide, a part of the barrier or the entire solder barrier is formed at the same time.

Bonding material, in particular solder and/or adhesive, may be arranged at the one of the top side and the underside.

Bonding material, in particular solder and/or adhesive, provided with a cover layer comprising gold may be arranged at the one of the top side and the underside, wherein forming the barrier comprises applying $SiO_2$ (silicon dioxide) on the one of the top side and the underside such that the one of the top side and the underside including the cover layer is completely covered with $SiO_2$, wherein after the covering $SiO_2$ is selectively removed from the cover layer such that the barrier is formed at least partly by the remaining $SiO_2$.

This affords the technical advantage, in particular, that the barrier may be formed efficiently. Providing the cover layer comprising gold on the bonding material, in particular the solder, affords the technical advantage, in particular, that the $SiO_2$ adheres only weakly to the cover layer such that the applied $SiO_2$ layer may be removed again efficiently and selectively from the cover layer comprising gold.

One or more of the following compounds from the group of oxides or nitrides or oxynitrides of Al, Ce, Ga, Hf, In, Mg, Nb, Rh, Sb, Si, Sn, Ta, Ti, Zn, Zr may be and/or respectively may have been used instead of or in addition to $SiO_2$.

The semiconductor chip may be a laser, wherein the barrier is configured in an open fashion at the HR side of the laser.

The semiconductor chip may be a laser, wherein the barrier is configured in an closed fashion at the AR side of the laser.

The barrier may comprise one or a plurality of gaps for the escape of air during the cohesive bonding.

The semiconductor chip may be a laser comprising a ridge waveguide, wherein the barrier is formed at a distance from the ridge waveguide.

One or a plurality of mesa trenches that receive the flowing bonding material may be formed at the one of the top side and the underside.

One of the one or the plurality of mesa trenches may extend from a first facet of the semiconductor chip to a second facet opposite the first facet, wherein the one mesa trench comprises two facet sections each adjoining one of the two facets and an intermediate section extending between the two facet sections, and wherein a depth of the intermediate section is greater than a respective depth of the two facet sections.

A plurality of optoelectronic semiconductor chips configured as lasers and forming a laser bar may be provided, wherein respectively each of the one of the top side and the underside of the semiconductor chips form a common underside and/or respectively top side of the laser bar.

A plurality of troughs may be formed at the common underside and/or respectively top side of the laser bar, in each case one or a plurality of lasers being arranged within the troughs.

The barrier, in particular the solder barrier, may comprise one or a plurality of walls such that at least one, in particular a plurality of, at least partly, in particularly completely, laterally closed trough(s) that receive the flowing bonding material is formed by the one or the plurality of walls and the mounting side.

Two troughs may be formed, wherein the two troughs are separated from one another by one or a plurality of closed walls.

The barrier may comprise one or a plurality of gaps for escape of air during the cohesive bonding, in particular during soldering and/or during adhesive bonding.

Alignment elements for the lateral alignment of the semiconductor chip during the process of arranging the semiconductor chip onto the carrier may be formed at the mounting side.

This affords the technical advantage, in particular, that an efficient lateral alignment of the semiconductor chip during the process of arranging the semiconductor chip onto the carrier is made possible.

The alignment elements may comprise one or a plurality of depressions and/or one or a plurality of stops.

This affords the technical advantage, in particular, that an efficient lateral alignment is made possible.

By way of example, the barrier of the semiconductor chip may cooperate with the alignment element(s) to efficiently carry out the lateral alignment. By way of example, one or the plurality of depressions at least partly receive(s) the solder barrier. By way of example, the plurality of stops or the one stop form(s) stops for the barrier such that an efficient lateral alignment is made possible by this means.

The carrier may be configured as a heat sink.

This affords the technical advantage, in particular, that heat (thermal energy) generated during operation of the semiconductor chip may be efficiently dissipated via the heat sink.

The main body may be formed from one or from a plurality of the following materials: copper, SiC, AlN, CuW, Al, ceramic and DBC (Direct Bonded Copper). The main body may thus be configured as a DBC main body.

A solder may comprise gold and/or tin and/or In. By way of example, the solder comprises AuSn. By way of example, an Au proportion is 60% to 90%, preferably 70% to 80%.

Solder may be applied by sputtering and/or vapor deposition onto the mounting side and/or respectively the one of the underside and the top side of the semiconductor chip. By way of example, the solder layer is formed which is configured, for example, as a single layer or as a layer stack (for example, alternately gold layer and tin layer).

By way of example, the surface of the solder layer is terminated with gold (cover layer comprising gold) to prevent oxidation of the solder.

A barrier layer comprising, for example, Pt and/or Ti and/or TiW and/or TiWN may be applied between a metal-semiconductor contact of the semiconductor chip and the solder. Such a barrier layer advantageously prevents the contact metal from intermixing with the solder.

Technical functionalities of the method of producing an optoelectronic lighting device are analogously evident from corresponding technical functionalities of the optoelectronic lighting device, and vice versa.

Technical functionalities of the method of producing a carrier for an optoelectronic semiconductor chip are analogously evident from corresponding technical functionalities of the carrier for an optoelectronic semiconductor chip, and vice versa.

The advantages described in association with the device and/or respectively the carrier are analogously applicable to the method of producing an optoelectronic lighting device and/or respectively to the method of producing a carrier for an optoelectronic semiconductor chip, and vice versa.

The optoelectronic lighting device may be and/or respectively is produced by the method of producing an optoelectronic lighting device.

The carrier for an optoelectronic semiconductor chip may be and/or respectively is produced by the method of producing a carrier for an optoelectronic semiconductor chip.

In other words, method features are evident from corresponding device features, and vice versa.

The barrier of the carrier may be configured or formed analogously to the barrier of the semiconductor chip. That is to say that the barrier of the carrier may comprise the same features as the barrier provided at the semiconductor chip.

The explanations correspondingly given in association with the optoelectronic lighting device are analogously applicable to the method and/or respectively to the carrier and/or respectively to the lighting system, and vice versa.

For example, the semiconductor chip is configured as an edge emitting semiconductor laser.

A semiconductor chip described in the context of this description is, for example, an LED semiconductor chip or, for example, a semiconductor laser chip.

The barrier may be arranged directly at an edge of the semiconductor chip. The barrier is thus located on the top side and/or respectively underside at the semiconductor chip edge. The fact that the barrier is arranged directly at the edge of the semiconductor chip means, in particular, that the barrier is flush with a sidewall of the semiconductor chip.

The barrier of the semiconductor chip may be in direct contact with the carrier after the process of arranging the semiconductor chip on the carrier, that is to say after the process of arranging the semiconductor chip on the mounting side. Therefore, in particular, after the process of arranging the semiconductor chip on the carrier, the barrier of the semiconductor chip is no longer spaced apart from the carrier. After the arranging, there is no longer a gap between the barrier of the semiconductor chip and the carrier. The barrier of the semiconductor chip thus touches the carrier after the process of arranging the semiconductor chip on the carrier.

The barrier of the carrier may be in direct contact with the semiconductor chip after the process of arranging the semiconductor chip on the carrier, that is to say after the process of arranging the semiconductor chip on the mounting side. Therefore, in particular, after the process of arranging the semiconductor chip on the carrier, the barrier of the carrier is no longer spaced apart from the carrier. After the arranging, there is no longer a gap between the barrier of the carrier and the semiconductor chip. The barrier of the carrier thus touches the semiconductor chip after the process of arranging the semiconductor chip on the carrier.

After the process of arranging the semiconductor chip on the carrier, that is to say after the process of arranging the semiconductor chip on the mounting side, a distance between the ridge waveguide and the carrier, that is to say the mounting side, may be formed. In the arranged state, therefore, the ridge waveguide and the mounting side are, for example, spaced apart from one another.

The barrier may be formed, in particular formed continuously, along a longitudinal direction of the semiconductor chip, in particular parallel in a longitudinal direction with respect to the ridge waveguide. The wording "formed continuously" means that the barrier is free of a gap along the longitudinal direction of the semiconductor chip, in particular parallel in a longitudinal direction with respect to the ridge waveguide.

The barrier of the carrier may be formed such that after a process of arranging the semiconductor chip on the carrier, that is to say after the process of arranging the semiconductor chip on the mounting side, the barrier is formed, in particular formed continuously, along a longitudinal direction of the semiconductor chip, in particular parallel in a longitudinal direction with respect to the ridge waveguide. The wording "formed continuously" means that the barrier is free of a gap along the longitudinal direction of the semiconductor chip, in particular parallel in a longitudinal direction with respect to the ridge waveguide.

The wording "and/or respectively" encompasses in particular the wording "and/or".

The above-described properties, features and advantages and the way in which they are achieved will become clearer and more clearly understood in association with the following description of examples explained in greater detail in association with the drawings.

Identical reference signs may be used hereinafter for identical features. For the sake of simplicity, the figures generally show only highly schematic illustrations of the optoelectronic semiconductor chips, in particular of the lasers. In general, an optoelectronic semiconductor chip within the meaning of this disclosure comprises in particular a plurality of epitaxial layers formed on a substrate, wherein the epitaxial layers preferably are and/or respectively have been patterned, wherein the epitaxial layers preferably are and/or respectively have been covered with passivation layers and/or metal pads. These details are generally omitted in the figures for the sake of simplicity such that in general only the optoelectronic semiconductor chip and a bond pad are depicted.

The concept of our barrier is explained by way of example below inter alia with reference to examples in which the semiconductor chip is soldered onto the carrier. Instead or in addition, according to further examples it is provided that the semiconductor chip is adhesively bonded onto the carrier.

FIG. 1 shows an optoelectronic lighting device 101 in a view from above. The optoelectronic lighting device 101 comprises an optoelectronic semiconductor chip 103. The optoelectronic semiconductor chip 103 is a laser chip, for example.

According to one example, the semiconductor chip 103 is configured as an edge emitting semiconductor laser.

The semiconductor chip 103 comprises a top side 105. Solder 107 is applied on the top side 105. Furthermore, a solder barrier 109 is formed on the top side 105 of the semiconductor chip 103.

The solder barrier 109 comprises four walls 111, 113, 115, 117, which form a self-contained rectangle, wherein the walls 117, 113 are the longitudinal walls of the rectangle and wherein the walls 111, 115 form the transverse walls of the rectangle.

Within the rectangle formed by the four walls 111, 113, 115, 117, the solder 107 is arranged at a distance from the four walls 111, 113, 115, 117.

The four walls 111, 113, 115, 117 of the solder barrier 109 together with the top side 105 form a trough, in which the solder 107 is received or arranged.

In a soldering process, the solder 107 is heated and deliquesces. On account of the solder barrier 109, however, the solder 107 may not flow beyond a chip edge and, for example, creep up a sidewall of the semiconductor chip 103. As a result, shunts at the chip edge may advantageously be prevented.

The reference sign 119 points to a sectional line (II-II) depicted in a dashed manner.

Figure 2:
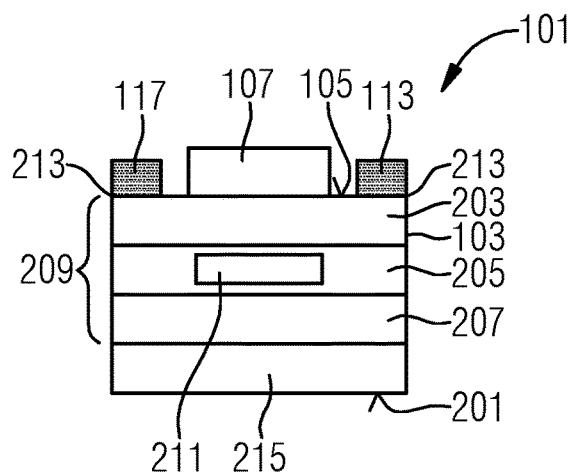
FIG. 2 shows the optoelectronic lighting device from FIG. 1.

FIG. 2 shows a cross-sectional view along the sectional line 119.

For the sake of better understanding, a semiconductor layer sequence 209 comprising a plurality of semiconductor layers 203, 205, 207 of the semiconductor chip 103 is illustrated schematically here. The semiconductor layer sequence 209 comprises an active zone 211 that generates electromagnetic radiation, in particular generating light.

The semiconductor layer sequence 209 is grown or arranged on a substrate 215.

That is to say our semiconductor chip may comprise a substrate on which the semiconductor layer sequence is arranged or grown.

The semiconductor chip 103 comprises an underside 201 opposite the top side 105.

The top side 105 of the semiconductor chip 103 may be the p-side. In this case, the underside 201 of the semiconductor chip 103 is then the n-side.

The p-side of the semiconductor chip denotes that side of the semiconductor chip 103 facing a p-doped semiconductor layer of the semiconductor layer sequence 209. Correspondingly, the n-side of the semiconductor chip 103 denotes that side of the semiconductor chip 103 facing an n-doped semiconductor layer of the semiconductor layer sequence 209.

Consequently, the solder 107 is thus applied, for example, on the p-side of the semiconductor chip 103, wherein the solder barrier 109 is thus likewise arranged or formed on the p-side of the semiconductor chip 103.

The semiconductor chip edge 213 is better discernible than in the cross-sectional view in FIG. 2. On account of the walls 111, 113, 115, 117, a flowing solder 107 may not flow beyond the chip edge 213 and creep up sidewalls of the semiconductor chip 103.

Figure 3:
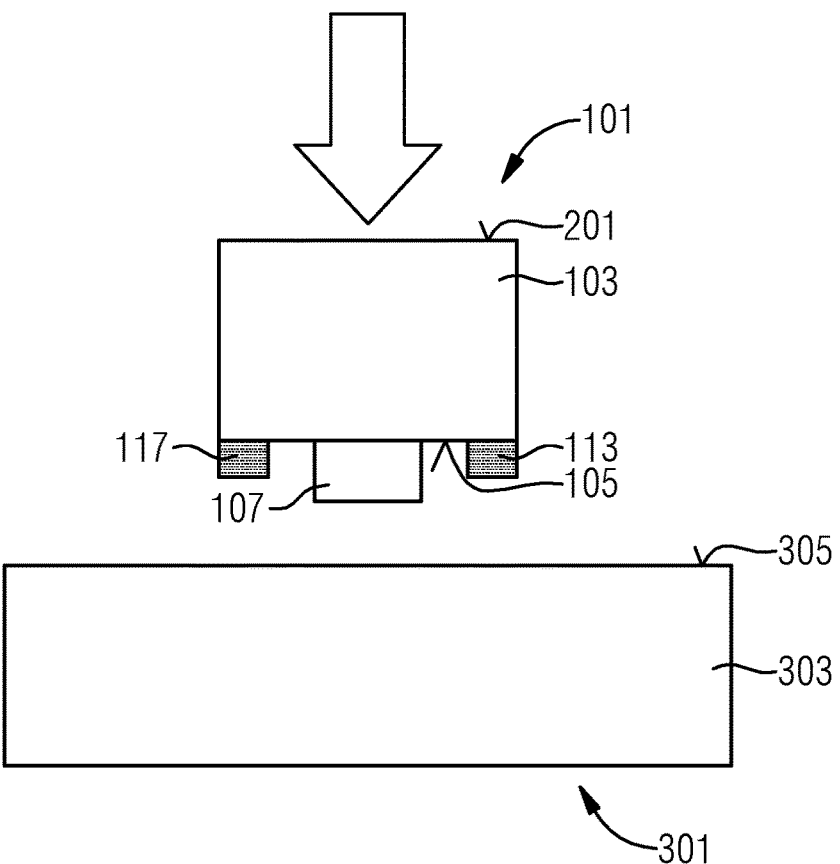
FIG. 3 shows the optoelectronic lighting device from FIG. 1 during a soldering process.

FIG. 3 shows the optoelectronic lighting device 101 and a carrier 301 in a lateral sectional view along the sectional line 119.

The carrier 301 comprises a main body 303. The main body 303 comprises a mounting side 305. The semiconductor chip 103 is arranged with the solder 107 and the solder barrier 109 onto the mounting surface 305 to subsequently solder the semiconductor chip 103 to the carrier 301, that is to say to the main body 303.

By way of example, the top side 105 may be the p-side of the semiconductor chip 103 such that the semiconductor chip 103 is soldered by the p-side onto the mounting surface 305.

Figure 4:
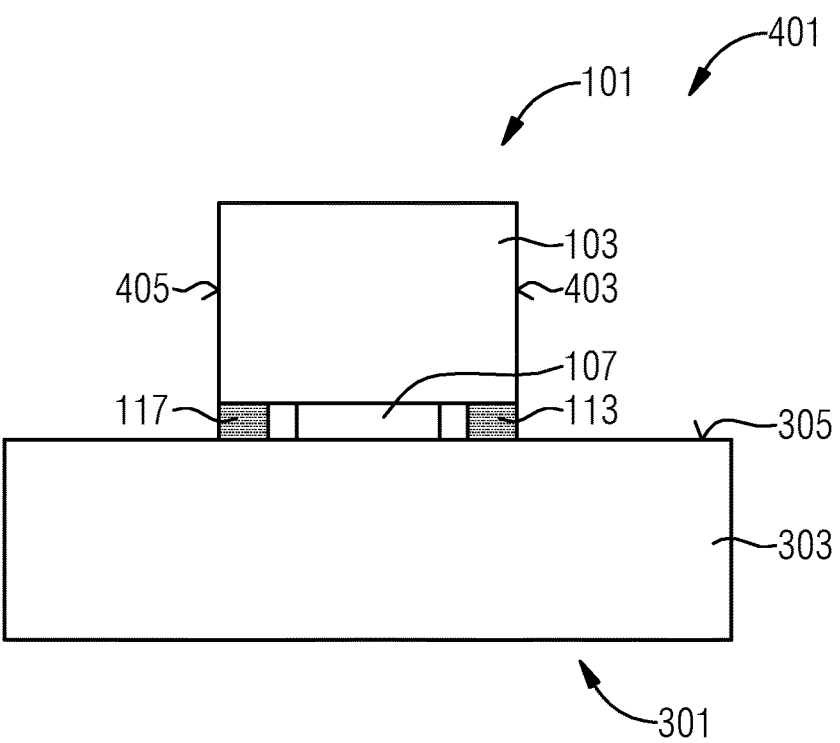
FIG. 4 shows an optoelectronic lighting system.

FIG. 4 shows an optoelectronic lighting system 401.

The lighting system 401 comprises the carrier 301 and also the optoelectronic lighting device 101, with the semiconductor chip 103 now being soldered on the carrier 301 by the solder 107.

On account of the presence of the solder barrier 109, the solder 107 may not flow beyond the chip edge 213 and creep up the sidewalls 403, 405 of the semiconductor chip 105. This might otherwise lead to a shunt at the chip edge 213 and/or to a shunt at the p-n-junction of the semiconductor layer sequence 209.

The walls 111, 113, 115, 117 thus firstly act as a barrier or a dam for the solder 107.

The walls 111, 113, 115, 117 furthermore act in particular as a spacer that predefines a minimum distance between the top side 105 of the semiconductor chip 103 and the mounting side 305 of the main body 303. This advantageously makes it possible to prevent the semiconductor chip 103 from being pressed onto the mounting surface 305 with an excessively high press-on pressure during the soldering process, which might otherwise lead to the solder 107 being pressed out.

The carrier 301 may be configured as a heat sink. This affords the technical advantage, for example, that heat generated during the operation of the semiconductor chip 103 may be efficiently dissipated. By way of example, the main body 303 may comprise copper.

The basic concept should therefore be seen, in particular, in that one or more walls, which may also be referred to as lateral walls, as in a trough, prevent the solder from flowing beyond the chip edge. As a result, shunts at the chip edge may advantageously be prevented.

Figure 5:
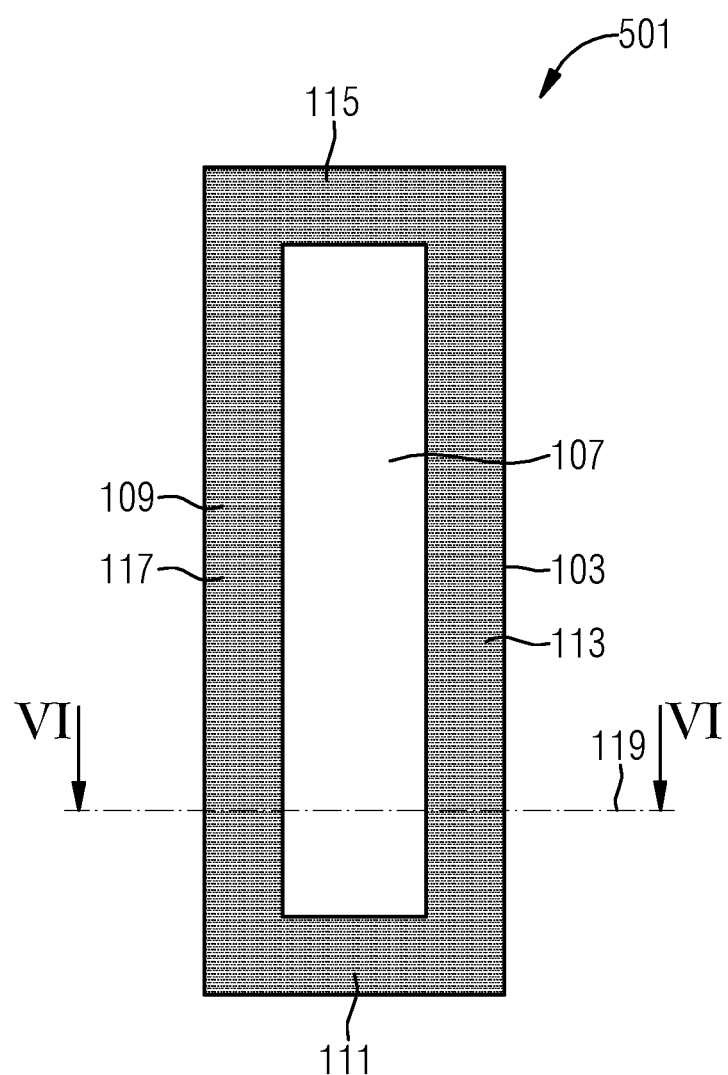
FIG. 5 shows an optoelectronic lighting device.

FIG. 5 shows an optoelectronic lighting device 501 in a view from above.

The lighting device 501 is configured substantially analogously to the lighting device 101 from FIG. 1. As a difference, the solder 107 is not arranged in a manner spaced apart from the walls 111, 113, 115, 117 of the solder barrier 109. Rather, the solder 107 is in direct contact with the walls 111, 113, 115, 117 of the solder barrier 109.

Figure 6:
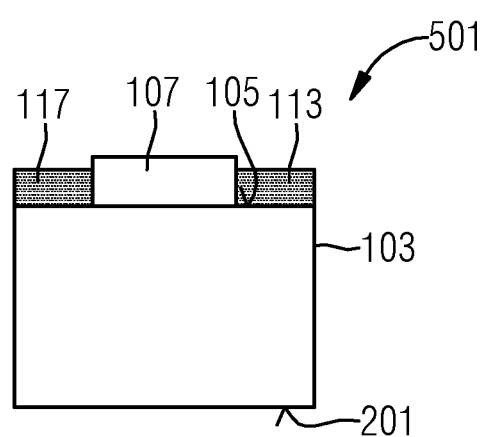
FIG. 6 shows the optoelectronic lighting device from FIG. 5.

FIG. 6 shows a cross-sectional view along the sectional line 119 (VI-VI) in accordance with FIG. 5.

The solder 107 may be applied directly on the top side 105 of the semiconductor chip 103. This is an alternative to applying on a bond pad. That is to say that alternatively, a bond pad is applied on the top side 105 of the semiconductor chip 103, wherein the solder 107 is then applied on the bond pad.

The solder 107 may be provided with a cover layer comprising gold. This advantageously prevents oxidation of the solder. This furthermore advantageously reduces an adhesion of a dielectric or of dielectrics. This plays a significant part when producing or forming a solder barrier, which is explained in greater detail below.

One or a plurality of lateral walls (walls) may be constructed around the solder 107, which prevent the solder 107 from flowing laterally and at the same time prevent excessively deep pressing in of the semiconductor chip 103 onto the main body 303. The latter, that is to say the excessively deep pressing in, might otherwise force out the solder 107 at the side of the semiconductor chip 103.

A height of one or a plurality or all of the walls 111, 113, 115, 117 may correspond to the height of the applied solder 107.

FIGS. 7 to 11 each show in a schematic illustration a point in time in a method of producing an optoelectronic lighting device.

Figure 7:
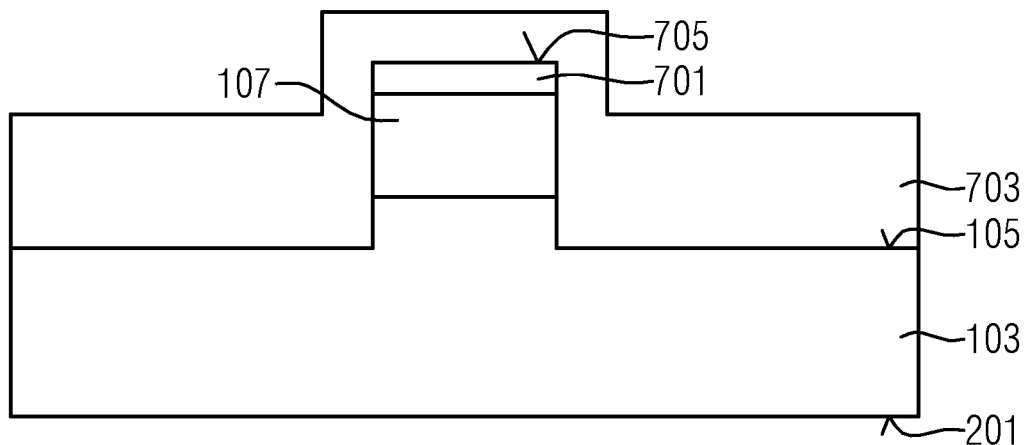
FIGS. 7 to 11 each show a view at a point in time in a method of producing an optoelectronic lighting device.

In accordance with FIG. 7, the semiconductor chip 103 is provided, wherein a silicon dioxide layer is formed on the top side 105. The top side 105 is thus completely provided with $SiO_2$. By way of example, it is provided that $SiO_2$ is applied by a sputtering process or by a CVD method. "CVD" stands for "Chemical Vapor Deposition".

The solder layer 107 or the solder is provided with a cover layer 701 comprising gold such that the $SiO_2$ is not applied directly on the top side of the solder 107, but rather on the surface 705 of the gold cover layer 701.

By virtue of the generally very low adhesion of the $SiO_2$ on the cover layer 701 comprising gold compared to the rest of the chip surface alongside the solder 107, the $SiO_2$ may advantageously be removed selectively in the region of the gold covering. This is shown schematically in FIG. 8. In this case, the reference sign 803 points to $SiO_2$ layer sections that have already been removed.

Consequently, an optoelectronic lighting device 801 is thus formed which comprises a solder barrier 109 analogously to the solder barrier shown in FIG. 5.

The cover layer 701 may be formed from gold or a gold alloy.

Selectively removing the $SiO_2$ layer may be carried out, for example, by a high-pressure treatment and/or applying and subsequently lifting off an adhesive tape (a so-called tape lift-off method).

Figure 9:
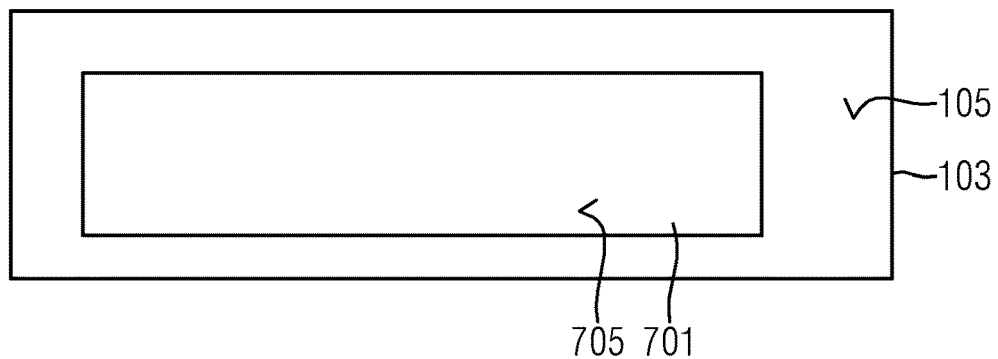

FIG. 9 shows the arrangement in accordance with FIG. 7 before applying $SiO_2$ on the top side 105.

Figure 10:
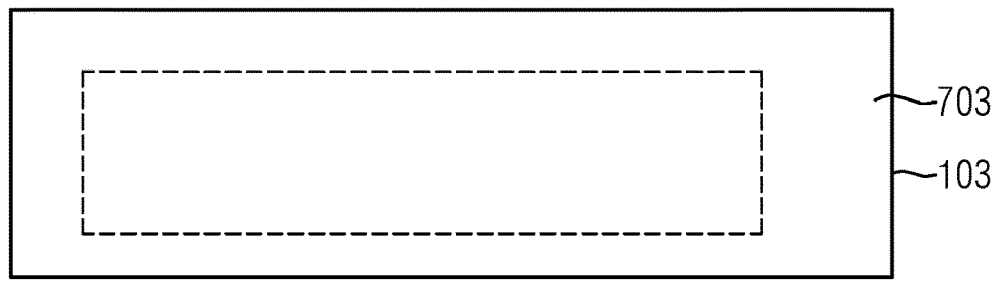

FIG. 10 shows the arrangement from FIG. 7 in a plan view.

Figure 8:
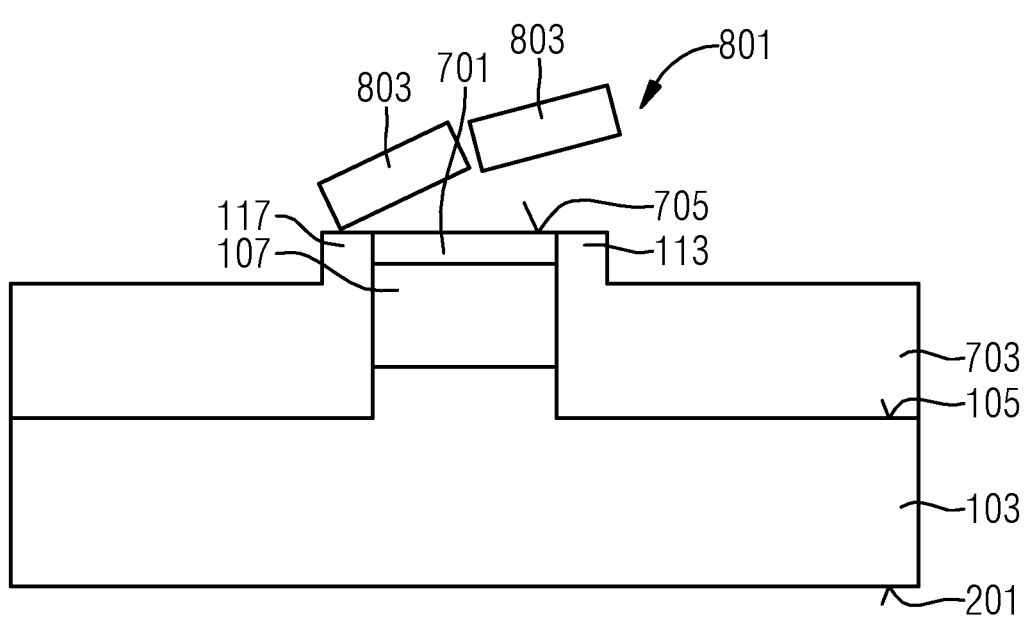
Figure 11:
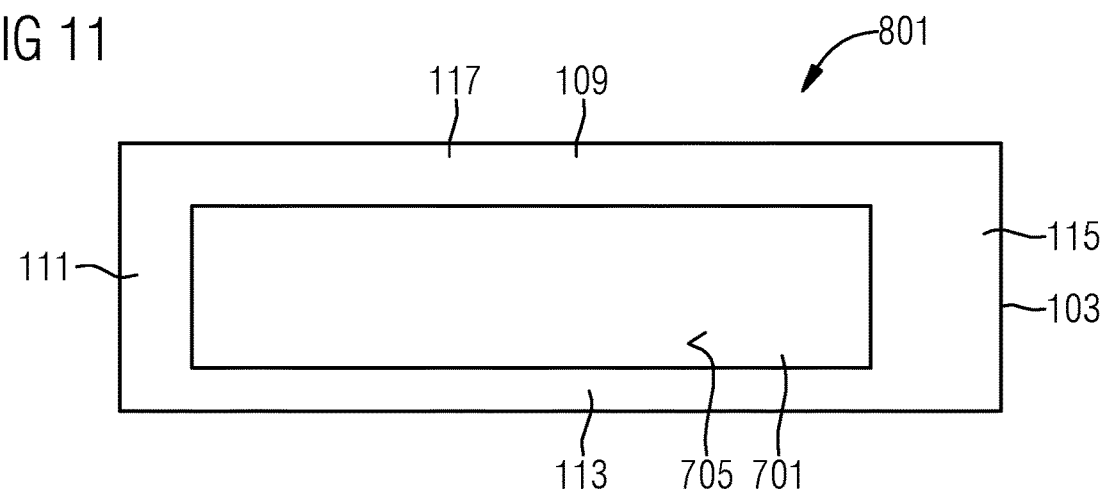

FIG. 11 shows the arrangement from FIG. 8, that is to say after selectively removing the $SiO_2$ layer, in a plan view.

Figure 12:
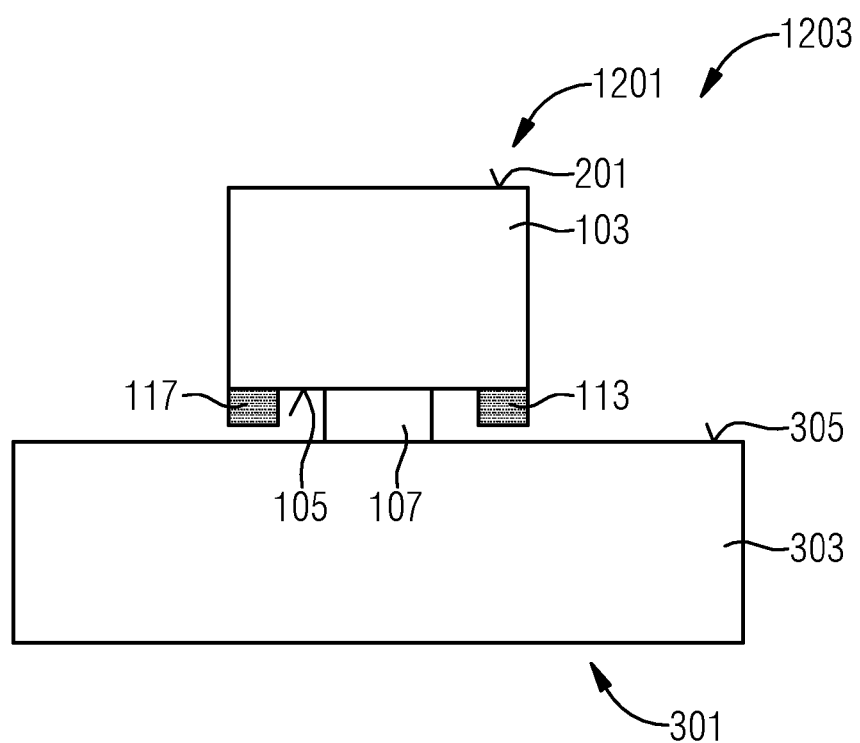
FIG. 12 shows an optoelectronic lighting system.

FIG. 12 shows an optoelectronic lighting system 1203 in a sectional view analogously to FIG. 2.

The lighting system 1203 comprises an optoelectronic lighting device 1201 configured substantially analogously to the lighting device 101 from FIG. 1.

As a difference, the solder 107 is dimensioned such, and/or the walls 111, 113, 115, 117 of the solder barrier 109 are dimensioned such, that the walls 111, 113, 115, 117 of the solder barrier 109 in the arranged state of the semiconductor chip 103 on the carrier 301 comprise no contact with the mounting surface 305 of the main body 303.

The walls 111, 113, 115, 117 of the solder barrier 109 comprise a distance with respect to the mounting surface 305 that may generally also be referred to as a solder surface such that the solder 107 comprises some space for expansion and/or flowing.

The volume within the walls 111, 113, 115, 117 may be chosen such that it corresponds to the volume of the solder 107.

The solder thus initially projects upward above the walls 111, 113, 115, 117, but upon contact with the mounting surface 305, which may generally also be referred to as a heat sink surface, may flow laterally and spread in the trough. The trough may thereby be filled completely or else only partly.

The volume of the trough may be smaller than the volume of the solder (solder volume). This affords the technical advantage, for example, that shrink holes may be avoided.

The volume of the trough may be larger than the solder volume. This affords the technical advantage, in particular, that it is possible to ensure that no solder flows out of the trough.

The semiconductor chip 103 may be pressed on until contact of the walls 111, 113, 115, 117 with the mounting surface 305 or else to a lesser extent. In the first case, a very accurate height positioning of the semiconductor chip and/or respectively of a light emission face of the semiconductor chip 103 is advantageously achieved. In the second case, the wall or the walls 111, 113, 115, 117 act(s) as a safety feature for a larger process window.

Figure 13:
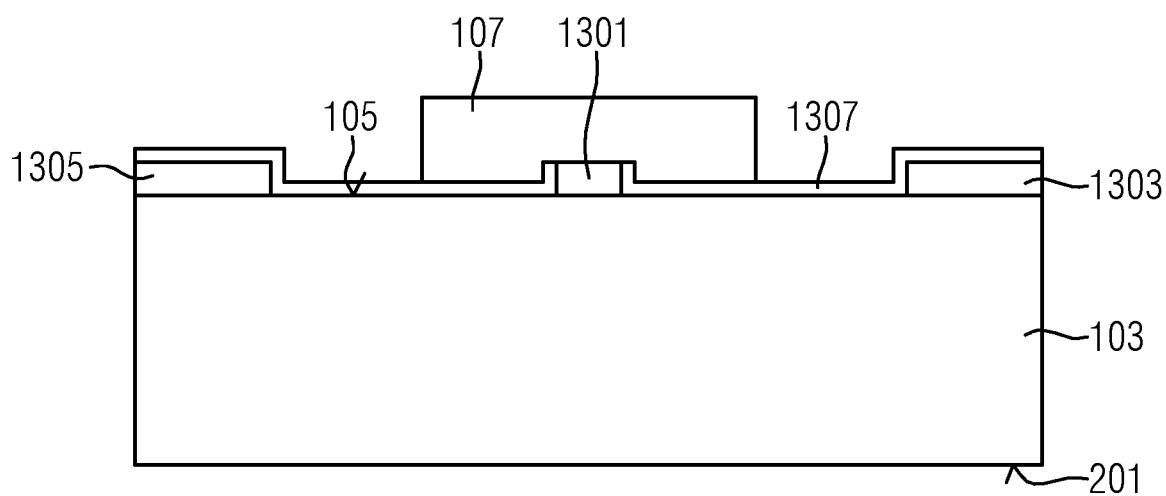
FIG. 13 shows an optoelectronic semiconductor chip at a point in time in a method of producing an optoelectronic lighting device.

FIG. 13 shows an optoelectronic semiconductor chip 103, wherein a ridge waveguide 1301 is formed by a part of the semiconductor layer sequence 209 being removed. A ridge waveguide 1301 may also be referred to as a "ridge". By way of example, the ridge 1301 is etched such that a part of the semiconductor layer sequence 209 is removed. Providing a ridge waveguide 1301 advantageously improves waveguiding of the electromagnetic radiation generated. The semiconductor layer sequence 209 may be left, for example, at the edge of the ridge waveguide 1301, this thereby already giving rise to the walls 111, 113, 115, 117 of the solder barrier 109 or at least a portion of the walls 111, 113, 115, 117. That is to say that the walls 111, 113, 115, 117 of the solder barrier 109 have been and/or respectively are formed, for example, at least partly, in particular completely, from the semiconductor layer sequence 209.

The lateral walls left in the semiconductor layer sequence 209 are identified by the reference signs 1303 and 1305.

A passivation layer 1307 is partly applied on the top side 105, wherein the solder 107 is applied on the passivation layer 1307.

Figure 14:
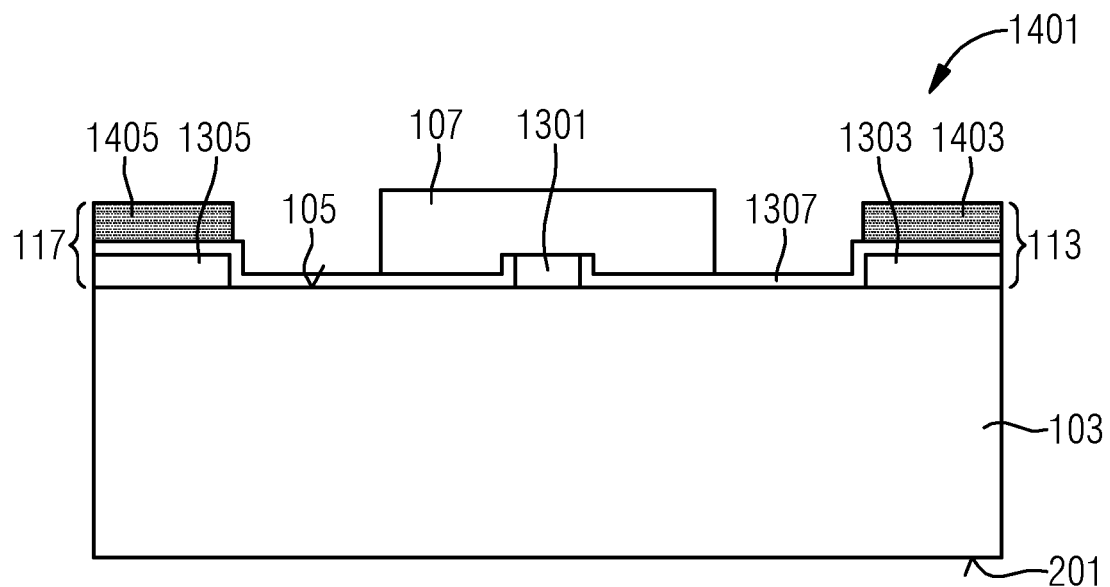
FIG. 14 shows an optoelectronic lighting device.

FIG. 14 shows the arrangement from FIG. 13, wherein a respective elevation 1403, 1405 is applied on the lateral walls 1303, 1305. The elevation 1403, 1405 has been formed, for example, by applying $SiO_2$. Instead of or in addition to $SiO_2$, by way of example, one or more compounds from the group of oxides or nitrides or oxynitrides of Al, Ce, Ga, Hf, In, Mg, Nb, Rh, Sb, Si, Sn, Ta, Ti, Zn, Zr may be used to form the elevations 1403, 1405.

Consequently, one portion of the walls 111, 113, 115, 117 is formed from the lateral walls 1303, 1305 left and another portion of the walls is formed from the additionally applied material, that is to say the elevation 1403, 1405.

FIG. 14 thus shows an optoelectronic lighting device 1401 in accordance with one example.

Figure 15:
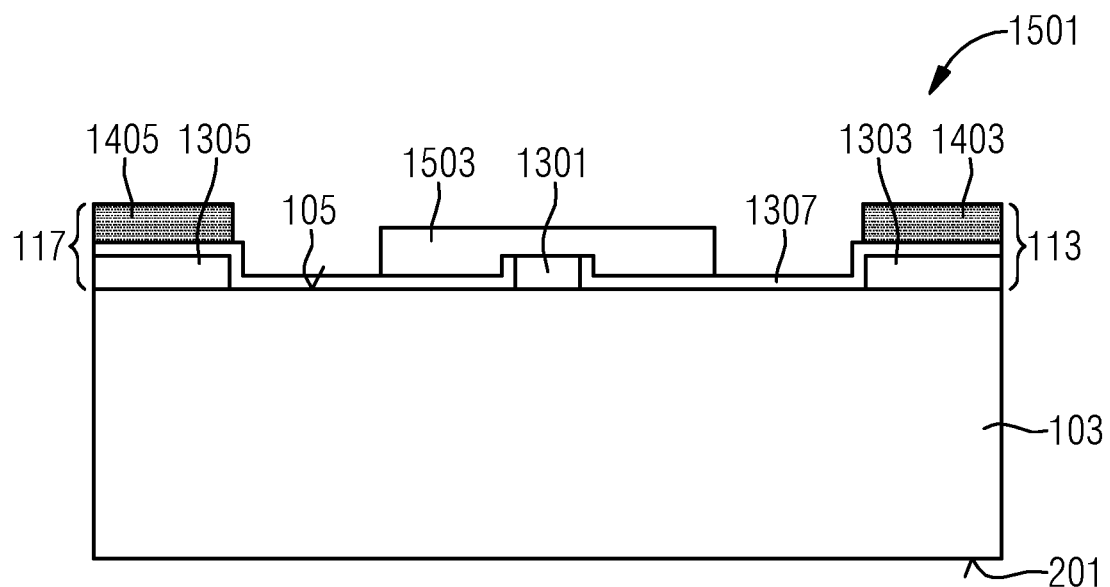
FIG. 15 shows an optoelectronic lighting device.

FIG. 15 shows the arrangement in accordance with FIG. 14 without the solder 107. Instead of the solder 107, a wetting layer 1503 has been applied on the top side 105. Such a wetting layer 1503 advantageously brings about an improved adhesion of solder to the top side 105. This is expedient, for example, if the solder 107 is applied on the mounting surface 305 of the main body 303.

Generally, the mounting surface 305 of a main body 303 may also be referred to as a mounting side. Mounting side and mounting surface of the main body are thus used synonymously.

FIG. 15 thus shows an optoelectronic lighting device 1501 in accordance with one example.

Instead of or in addition to the wetting layer 1503, a contact pad is provided according to a further example.

The elevation 1403, 1405 may be applied directly on the lateral walls 1303, 1305 left, wherein only then is the passivation layer 1307 applied on the elevations 1403, 1405.

The elevation 1403, 1405 may be located above or below the passivation layer 1307.

Figure 16:
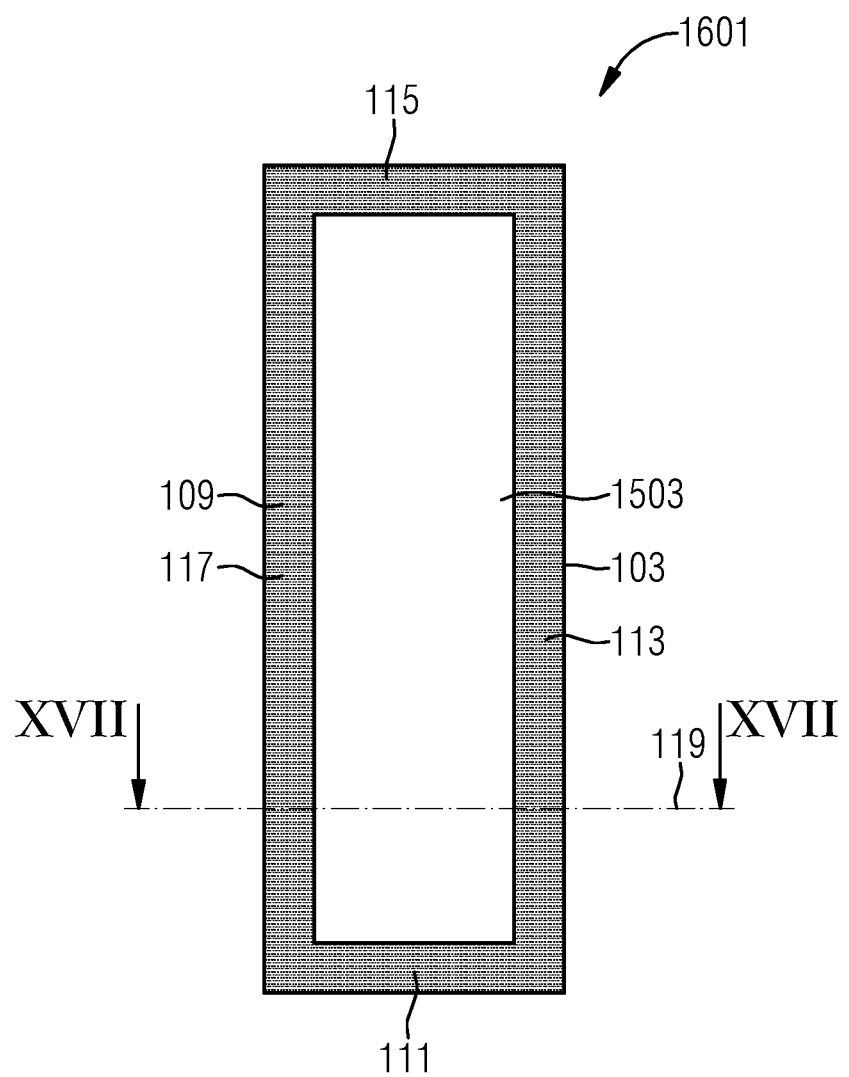
FIG. 16 shows an optoelectronic lighting device.

FIG. 16 shows an optoelectronic lighting device 1601 configured substantially analogously to the optoelectronic lighting device 801 from FIG. 8.

As a difference, the top side 105 is not provided with solder. The optoelectronic lighting device 1601 is free of solder. A wetting layer 1503 is provided instead of the solder 107 with the cover layer 701 comprising gold. The wetting layer 1503 is provided or arranged within the trough formed by the walls 111, 113, 115, 117 of the solder barrier 109 and the top side 105 of the semiconductor chip 103.

Figure 17:
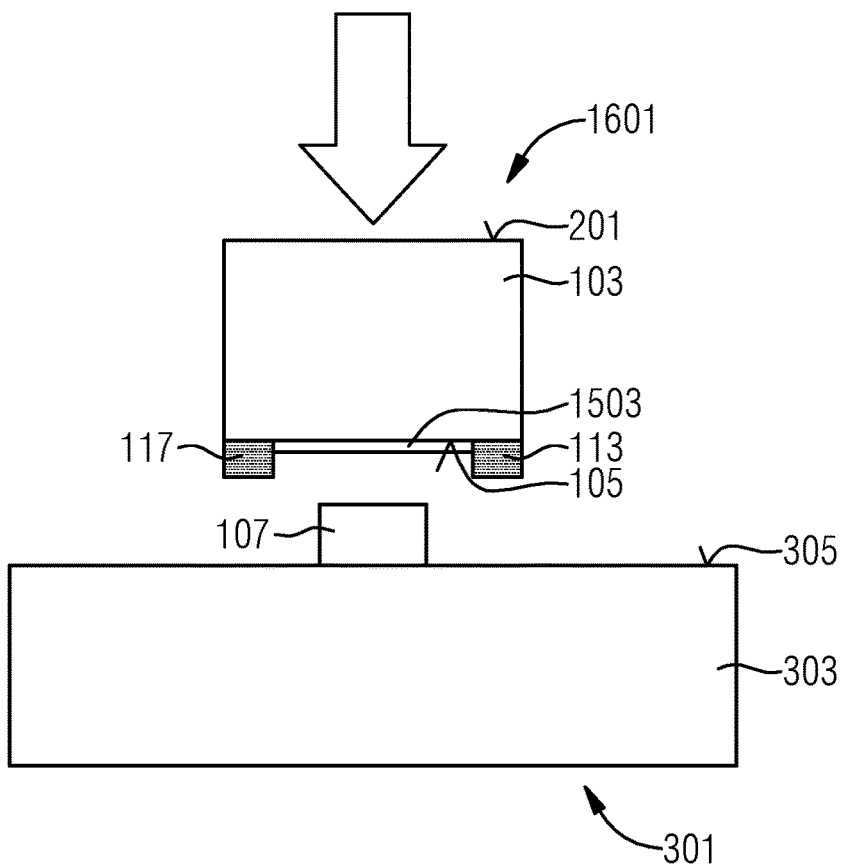
FIG. 17 shows the optoelectronic lighting device from FIG. 16 and also a carrier for an optoelectronic lighting device.

FIG. 17 shows a cross-sectional view along the sectional line 119 (XVII-XVII) in accordance with FIG. 16.

The solder 107 is now provided on the mounting side 305 or mounting surface of the main body 303 of the carrier 301. The solder barrier 109 is furthermore provided at the top side 105 of the semiconductor chip 103.

The semiconductor chip 103 is thus arranged by its top side 105 onto the solder 107 of the main body 303.

Figure 18:
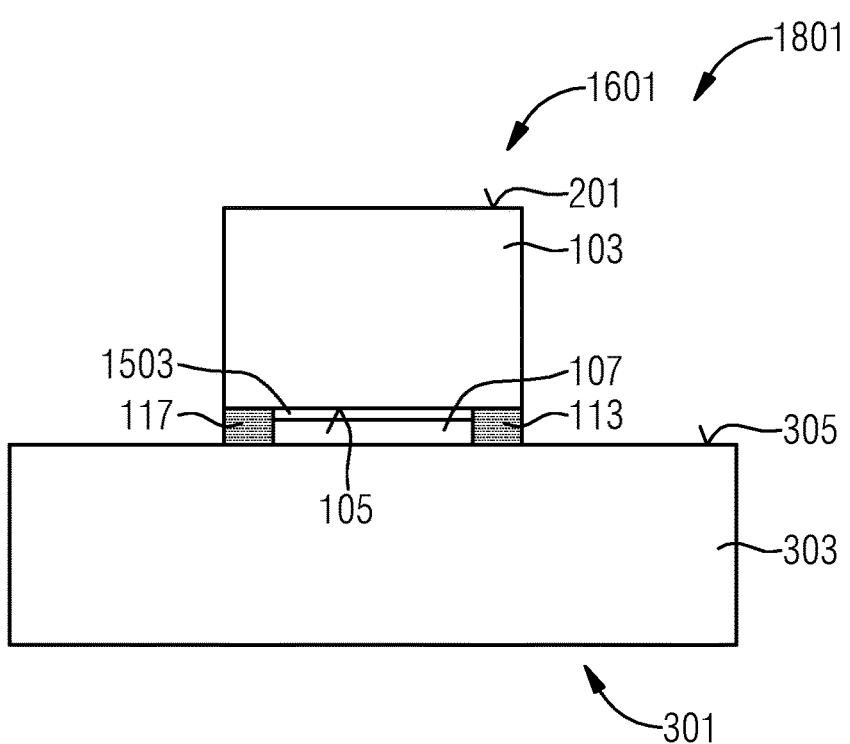
FIG. 18 shows an optoelectronic lighting system.

FIG. 18 shows the arrangement in accordance with FIG. 17 after soldering.

Providing the solder barrier 109 advantageously prevents the solder 107 applied on the mounting side 305 from running beyond the semiconductor chip edge and creeping up the sidewalls during soldering. Shunts are advantageously avoided as a result.

Providing the wetting layer 1503, which may also be referred to as a contact layer, within the trough thus advantageously brings about an improved and efficient adhesion of the semiconductor chip 103 to the main body 303.

FIG. 18 thus shows an optoelectronic lighting system 1801 in accordance with one example.

The solder may be provided on the main body of the carrier. Since the main body thus comprises a certain structure, the main body may also be referred to as a structured main body. Insofar as the carrier is configured as a heat sink, in this case reference may be made to a structured heat sink.

The amount of solder 107 provided may be only as much as may be received within the trough.

The wetting layer 1503 within the trough is as wide as the trough itself according to one example, or narrower according to a further example.

Figure 19:
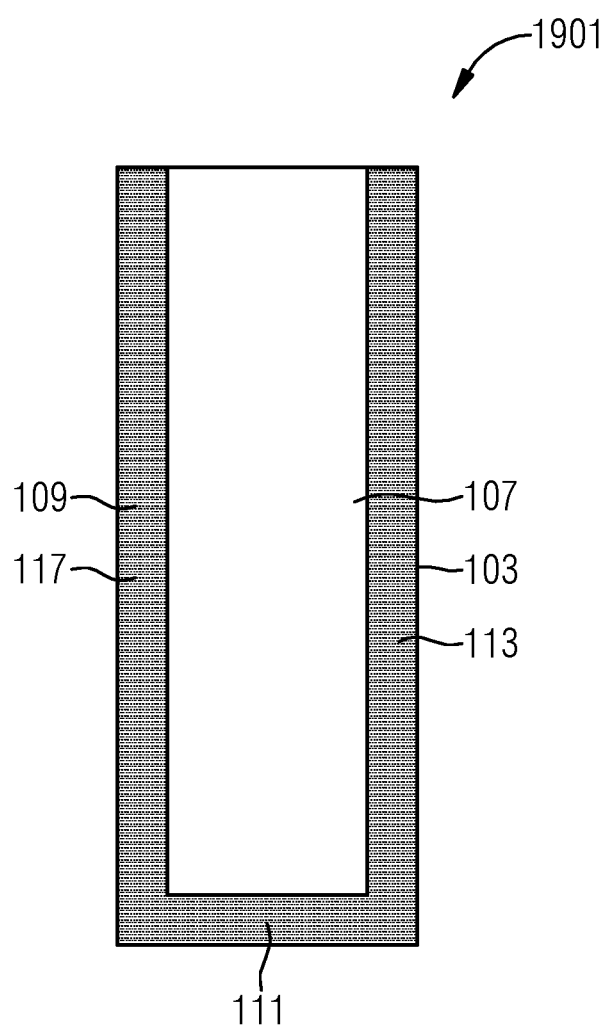
FIGS. 19 to 22 each show an optoelectronic lighting device.

FIG. 19 shows a further optoelectronic lighting device 1901 in a simplified plan view.

The lighting device 1901 is configured substantially analogously to the lighting device 101 from FIG. 1.

As a difference, the trough is open at one side. The solder barrier 109 comprises only three walls 111, 113 and 117. One transverse wall 115 is absent. The trough is thus open at one side and thus only partly laterally closed.

If the semiconductor chip 103 is a laser, the trough may be open toward the HR side of a laser. This, for example, advantageously prevents the solder from streaming out at the AR side of the laser and disturbing an emission characteristic. For example, the trough is closed at the AR side.

The HR side of the laser is thus located at the open side of the trough. The AR side of the laser is thus located at the transverse wall 111.

Figure 20:
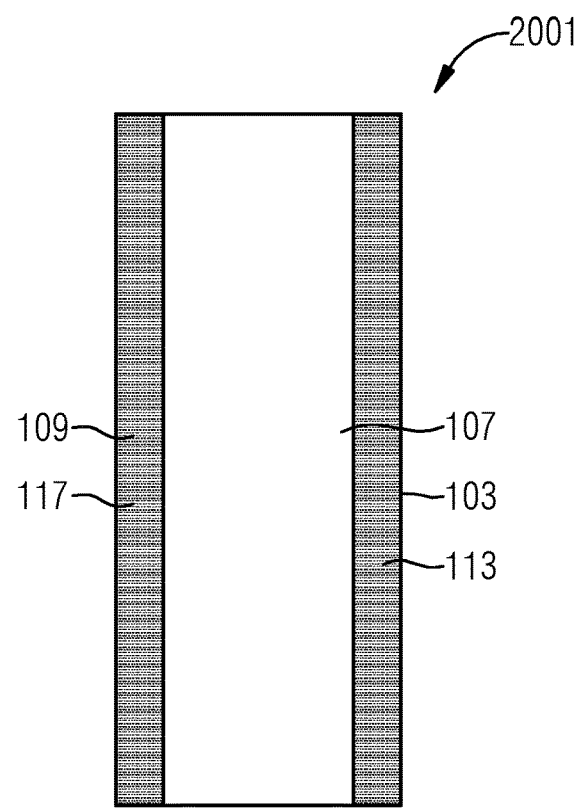

FIG. 20 shows a further optoelectronic lighting device 2001 in a simplified plan view.

The lighting device 2001 is configured substantially analogously to the lighting device 101 in accordance with FIG. 1. As a difference, the trough is open at the transverse sides of the rectangle. The transverse walls 111, 115 are absent. The solder barrier 109 is thus formed merely from the two walls 113, 117.

Figure 21:
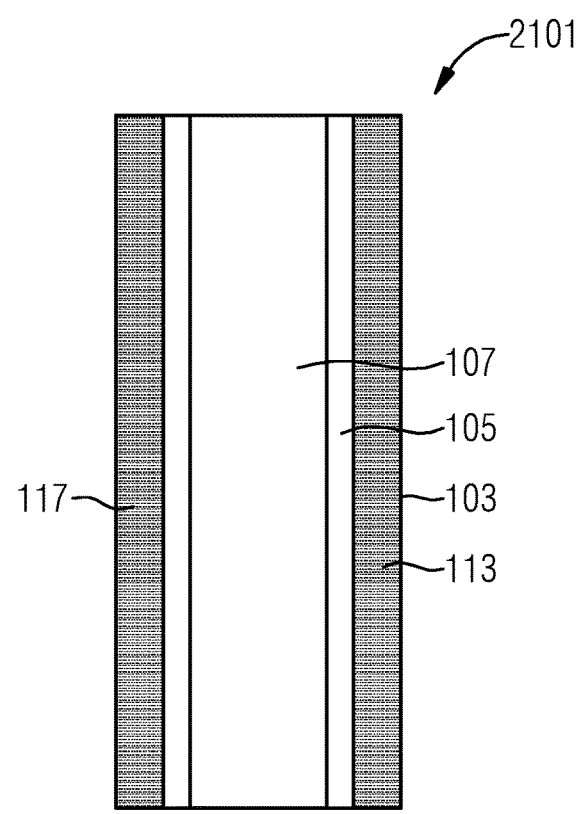

FIG. 21 shows a lighting device 2101 configured substantially analogously to the lighting device 2001 in accordance with FIG. 20.

As a difference, the solder 107 is applied in a manner spaced apart from the two opposite longitudinal walls 113, 117 on the top side 105 of the semiconductor chip 103. Insofar as the semiconductor chip 103 is configured as a laser comprising a ridge, this advantageously affords the technical advantage that the walls 113, 117 do not touch the ridge such that the latter is thereby mechanically relieved of loading. This advantageously brings about a better aging stability of the semiconductor chip 103.

Examples thus provide for the trough to be open laterally toward one or a plurality of sides to advantageously enable excess solder to flow away.

Even if solder is actually forced out at one of the facets on account of the excess solder flowing away, this is generally not particularly critical for the following reasons: lasers are generally reflectively coated, for example, coated with a dielectric, in the facet region. As a result, they are electrically passivated at the same time. There is usually no such passivation at the sidewalls of a semiconductor chip, with the result that shunts may arise particularly easily here.

The walls may also be open at other defined locations at which, for example, the chip sidewalls are configured in a targeted manner such that the sidewalls are less sensitive to shunts. In this regard, by way of example, the wall may be opened in a region where the mesa trench (also referred to simply as mesa) is etched very deeply. However, a deep mesa comprises disadvantages during facet cleavage. We advantageously make it possible that the mesa (that is to say the mesa trench or the mesa trenches) need respectively be formed more deeply only at specific locations where this does not disturb facet cleavage, for example. The walls are then open there.

Figure 22:
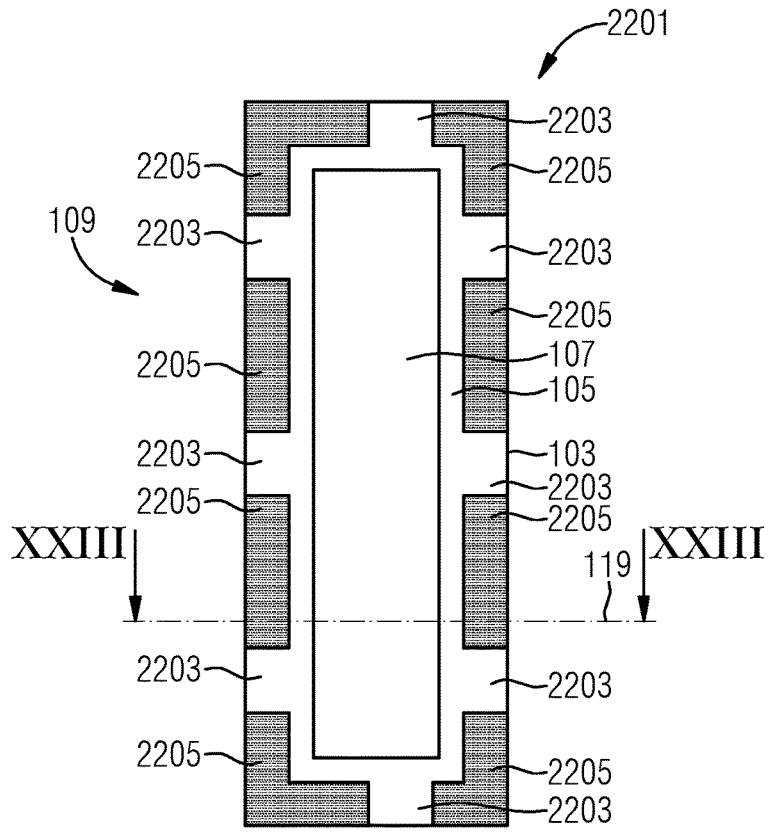

FIG. 22 shows an optoelectronic lighting device 2201.

The optoelectronic lighting device 2201 is configured substantially analogously to the lighting device 101 in accordance with FIG. 1. As a difference, the four walls 111, 113, 115, 117 of the solder barrier 109 comprise gaps 2203. The individual walls of the rectangle or the trough are not completely closed, but rather are interrupted at one or at a plurality of locations, that is to say the gaps 2203.

Consequently, a plurality of walls 2205 spaced apart from one another are thus arranged or formed on the top side 105 of the chip 103. Advantageously, air may escape laterally through the gaps 2203 during soldering. Nevertheless, the walls 2205 spaced apart from one another still act as a spacer that prevents the solder 107 from being forced out below the semiconductor chip 103.

The reference sign 119 (XXIII-XXIII) points to a sectional line through the semiconductor chip 103. The corresponding sectional view is shown in FIG. 23.

Figure 23:
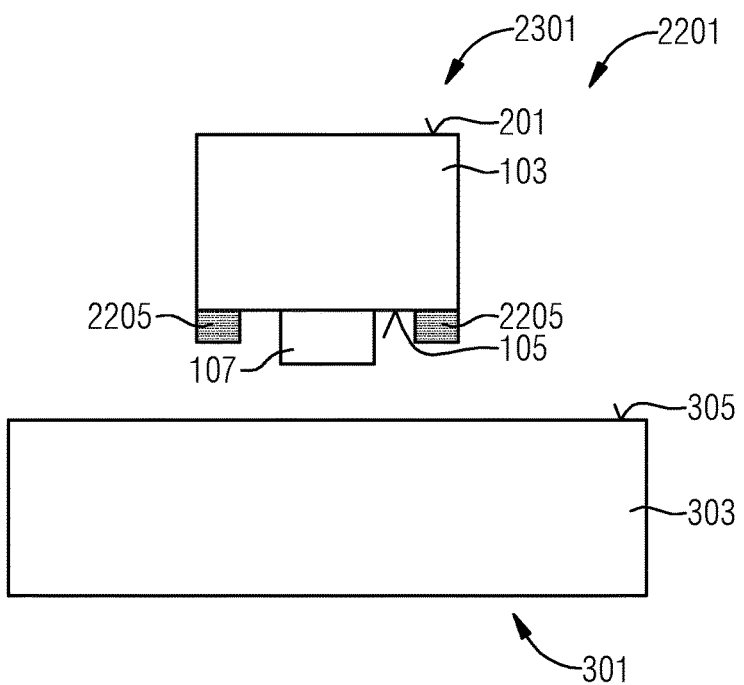
FIG. 23 shows the optoelectronic lighting device from FIG. 22 and a carrier for an optoelectronic lighting device.

FIG. 23 shows an optoelectronic lighting system 2301.

The lighting system 2301 comprises the lighting device 2201 from FIG. 22 and a carrier 301. In the illustration shown in FIG. 23, the lighting device 2201 has not yet been soldered on the carrier 301.

Figure 24:
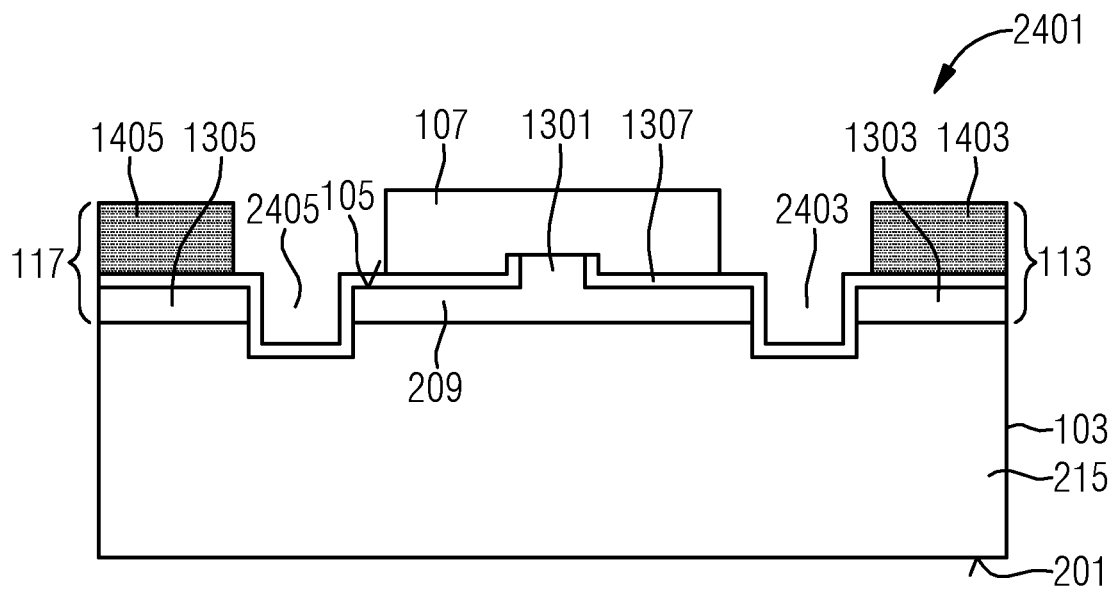
FIG. 24 FIG. shows an optoelectronic lighting device.

FIG. 24 shows an optoelectronic lighting device 2401 in a cross-sectional view.

The lighting device 2401 is configured substantially analogously to the lighting device 1401 in accordance with FIG. 14.

As a difference, two mesa trenches 2403, 2405 are formed at the top side 105 of the semiconductor chip 103. The mesa trenches 2403, 2405 extend within the trough. The mesa trenches 2403, 2405 are preferably covered with the passivation layer 1307.

Providing such mesa trenches 2403, 2405 advantageously has the effect that more volume is available for a solder outflow.

The mesa trenches 2403, 2405 may comprise a length that is shorter than a length of the semiconductor chip 103.

A length of a mesa trench may correspond to a length of the semiconductor chip.

By virtue of the mesa trenches arranged within the trough, more volume for the solder 107 to flow away is thus advantageously made available.

Figure 25:
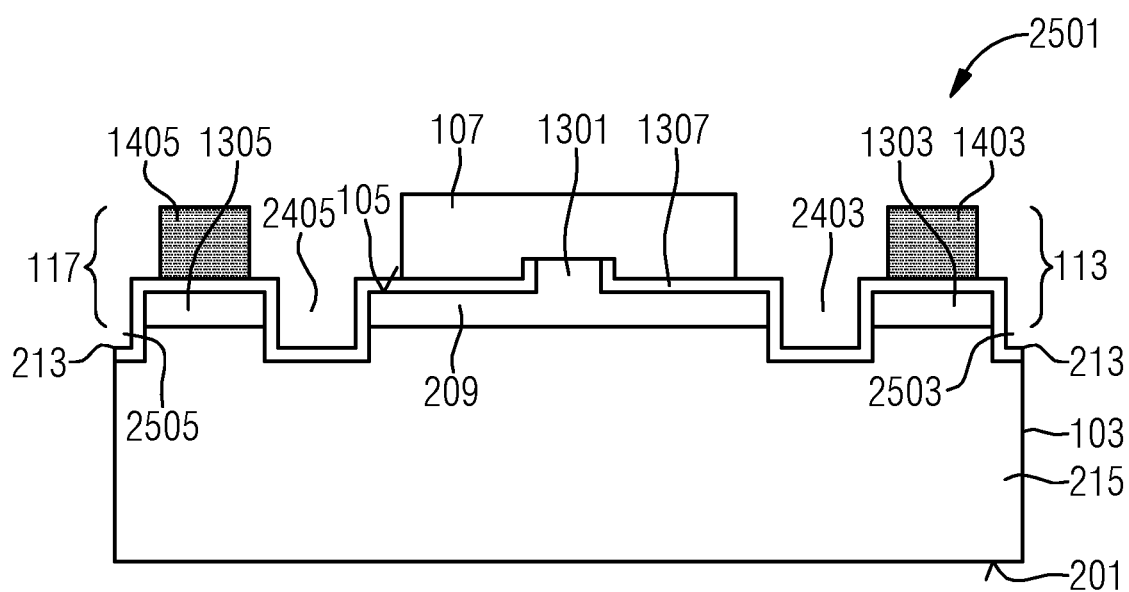
FIG. 25 shows an optoelectronic lighting device.

FIG. 25 shows an optoelectronic lighting device 2501 in a cross-sectional view.

The lighting device 2501 is configured substantially analogously to the lighting device 2401 in accordance with FIG. 24.

In addition to the two mesa trenches 2403, 2405, mutually opposite mesa trenches 2503, 2505 are provided or formed which are arranged outside the trough.

The mesa trenches 2503, 2505 extend along the longitudinal direction of the trough at the edge of the top side 105 of the semiconductor chip 103. The mesa trenches 2503, 2505 thus extend as far as the chip edge 213. The mesa trenches 2503, 2505 may be provided with the passivation layer 1307.

The mesa trenches 2503, 2505 arranged outside the trough also advantageously have the effect that an additional volume is available for the solder outflow. This advantageously brings about additional safety against short circuits at the chip edge 213.

Figure 26:
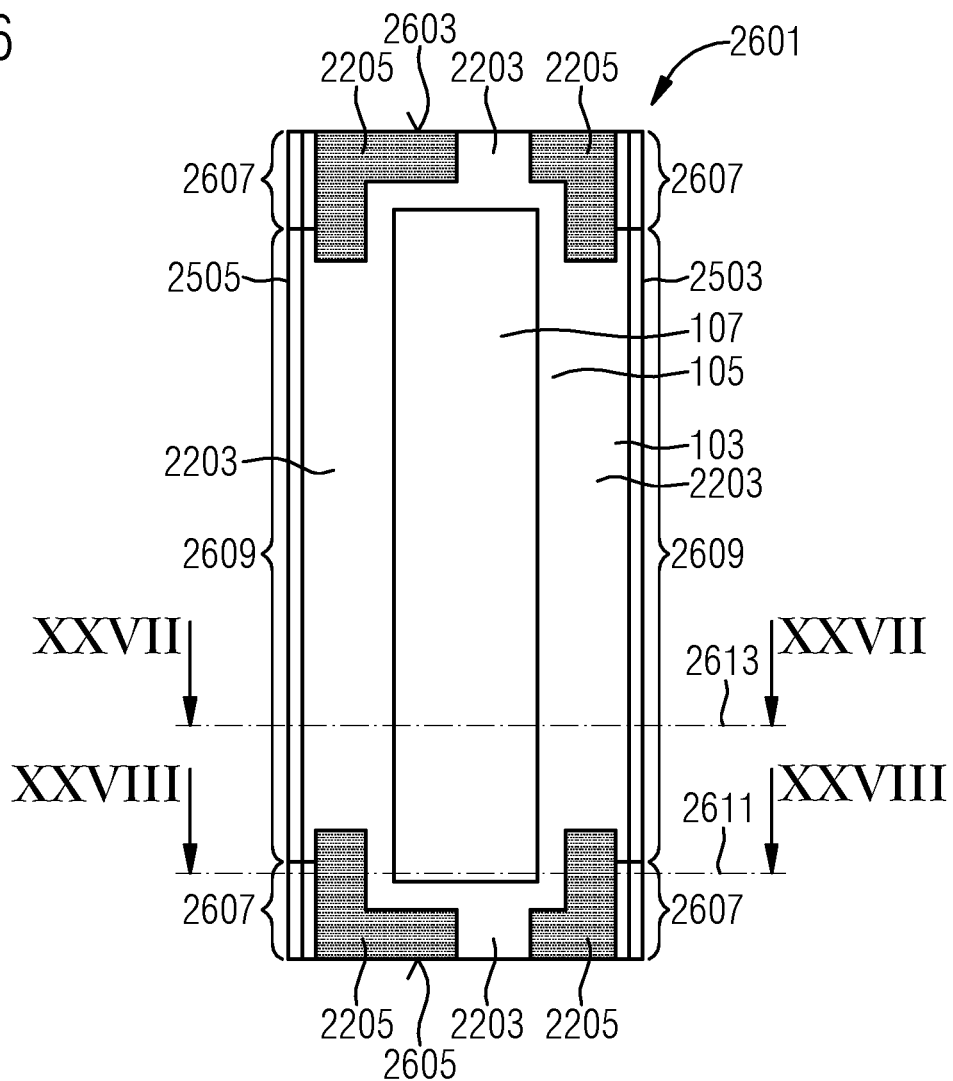
FIG. 26 shows an optoelectronic lighting device.

FIG. 26 shows an optoelectronic lighting device 2601 in a plan view.

The lighting device 2601 comprises four walls 2205 spaced apart from one another. Gaps 2203 are formed between the walls 2205. The walls 2205 form a solder barrier 109.

Mesa trenches 2503, 2505 are formed in a longitudinal direction at the edge of the top side 105, analogously to the lighting device 2501 from FIG. 25.

The mesa trenches 2503, 2505 each comprise two facet sections 2607. The facet sections 2607 each adjoin a facet 2603 and/or respectively 2605 of the semiconductor chip 103. The two facets 2603, 2605 are formed opposite one another.

An intermediate section 2609 is formed between each facet section 2607. Therefore each mesa trench 2503, 2505 extends from one facet 2603 to the other facet 2605 and each comprises a facet section 2607 adjoining one of the two facets 2603, 2605 and an intermediate section 2609 extending between the two facet sections 2607.

The depth of the intermediate section 2609 may be greater than a respective depth of the two facet sections 2607.

For the sake of better illustration, two sectional lines 2611 (XXVIII-XXVIII), 2613 (XXVII-XXVII) are depicted as dashed lines in FIG. 26.

Figure 27:
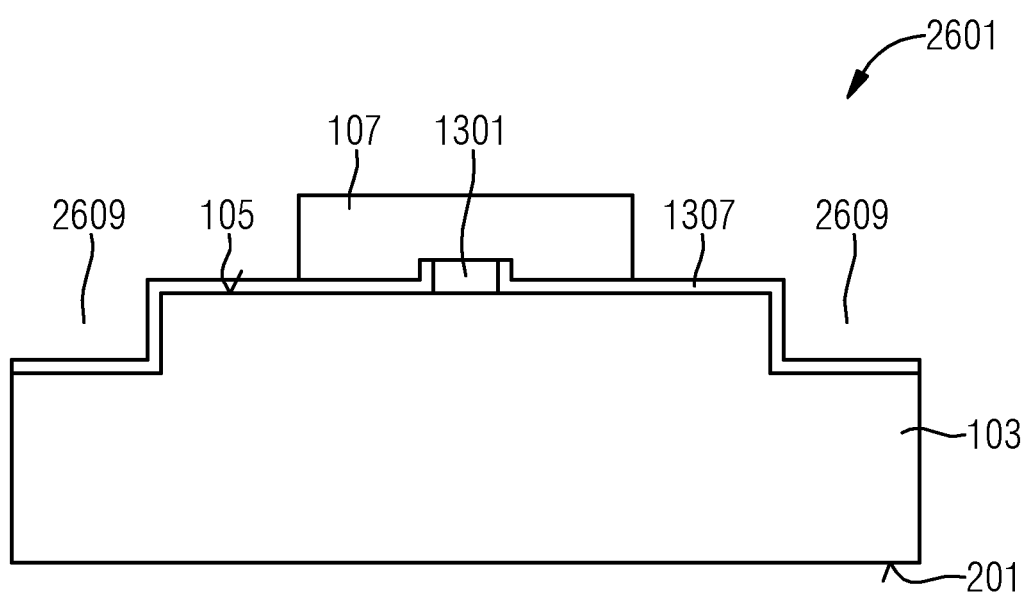
FIGS. 27 and 28 each show a different sectional view of the optoelectronic lighting device from FIG. 26.

FIG. 27 shows a cross-sectional view along the sectional line 2613 (XXVII-XXVII).

Figure 28:
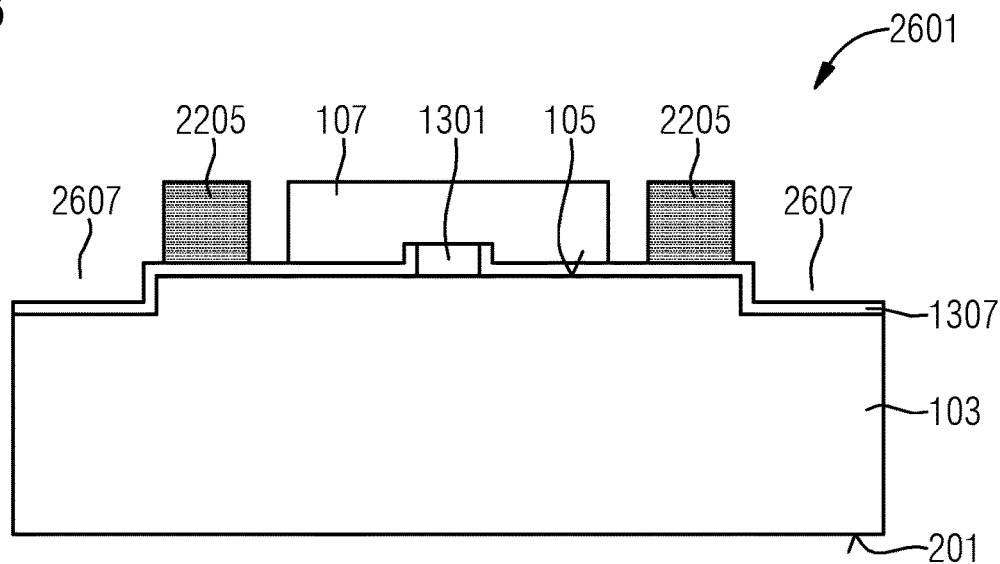

FIG. 28 shows a cross-sectional view along the sectional line 2611 (XXVIII-XXVIII).

Thus, the depth of one or more mesa trenches may vary over a chip length. By way of example, an etching depth of the mesa trenches varies over the chip.

In the region of a facet, the depth, in particular the etching depth, is smaller than in the intermediate section to advantageously ensure an optimum quality during facet cleavage.

In a region further away from the facets, that is to say in the intermediate section, a depth, in particular an etching depth, is larger to efficiently prevent solder from creeping up and thus to efficiently prevent short circuits.

The lighting device 2601 comprises a solder barrier 109, the walls 2205 of which adjoin the facet region 2607. Applying walls in the facet region 2607 advantageously has the effect that during soldering the solder 107 is kept away from the flat region, that is to say from the facet sections 2607, of the mesa trenches 2503, 2505. This advantageously prevents a short circuit or short circuits.

In the deeper regions, the intermediate sections 2609, the flowing solder 107 may spread freely during soldering. This advantageously brings about a process safety with regard to a solder volume/trench volume (volume of the mesa trench 2503, 2505). In these regions, in the intermediate sections 2609, there is generally no risk of short circuits via the sidewall 403, 405, since here the intermediate section 2609 generally has a sufficient depth to prevent the solder 107 from creeping up right into an unpassivated n-conducting region of the substrate 215.

Figure 29:
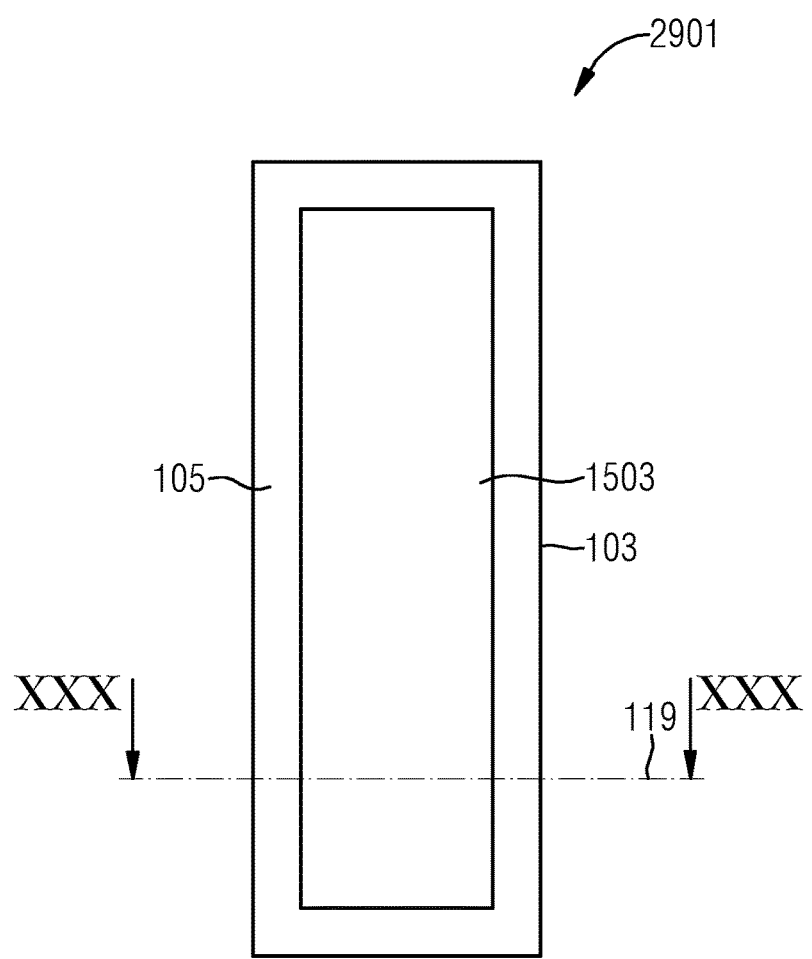
FIG. 29 shows an optoelectronic lighting device.

FIG. 29 shows an optoelectronic lighting device 2901 in a plan view.

The lighting device 2901 is free of a solder barrier. No walls of a trough are formed at the top side 105. Furthermore, the lighting device 2901 is free of a solder. Instead of the solder, a wetting layer 1503 is applied on the top side 105 of the semiconductor chip 103.

Figure 30:
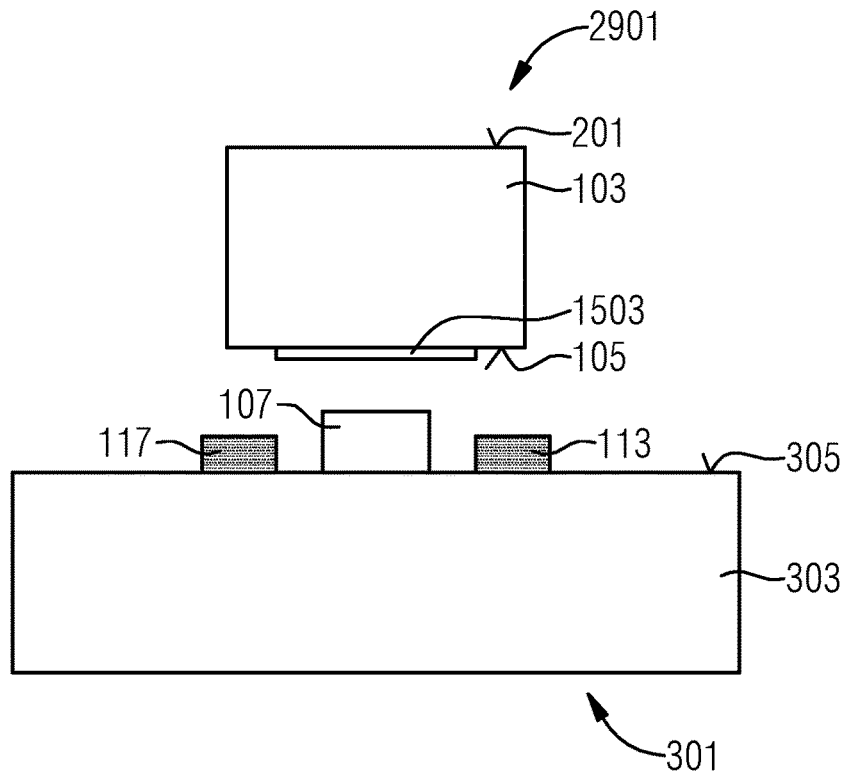
FIG. 30 shows the optoelectronic lighting device from FIG. 29 and a carrier for an optoelectronic lighting device.

FIG. 30 shows a cross-sectional view along the sectional line 119 (XXX-XXX) in accordance with FIG. 29.

The lighting device 2901 is arranged onto a carrier 301 to solder the semiconductor chip 103 onto the carrier 301.

The carrier 301 comprises a main body 303, comprising a mounting side 305 or mounting surface. Solder 107 is arranged on the mounting side 305. The solder 107 is received within a solder barrier. Analogously to the solder barriers, as has been described in association with the various lighting devices, such a solder barrier may analogously also be formed or arranged or configured on the mounting side 305 of the main body 303. Consequently, the solder barrier of the carrier 301 comprises walls 113, 117 analogously to the walls 113, 117 of the lighting device 101 in accordance with FIG. 1. Likewise, the solder barrier of the carrier 301 may comprise transverse walls 111, 115 analogously to the walls 111, 115 of the solder barrier 109 of the lighting device 101 in accordance with FIG. 1.

The resultant technical advantages and technical effects should thus be seen analogously to the technical advantages and technical effects as described in association with the lighting devices.

Figure 31:
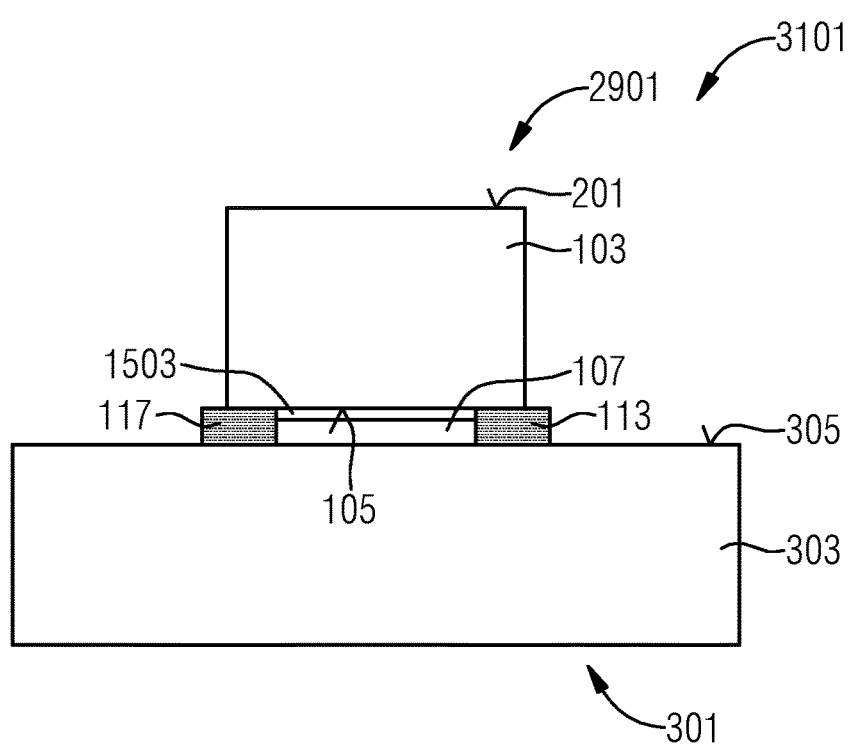
FIG. 31 shows an optoelectronic lighting system.

FIG. 31 shows the lighting device 2901 in a soldered state. The semiconductor chip 103 is soldered on the main body 303 by the solder 107.

FIG. 31 thus shows an optoelectronic lighting system 3101 according to one example.

The trough that receives the solder or is intended to receive it in the soldering process is also formed or structured on the mounting side of the main body of the carrier.

The width of a bond pad, in particular of a bond pad of a laser, may be less than 200 µm, in particular less than 100 µm, since the bond pad is generally required only for contacting on the solder 107.

The wetting layer 1503 comprises, for example, a width of less than 200 µm, in particular less than 100 µm.

This is because, in examples in which the solder is applied on the mounting side 305, in general it is no longer necessary for a bond ball on the top side 105 of the semiconductor chip 103 to find space on a bond pad.

The solder 107 may be applied or arranged on the top side 105 and/or on the mounting side 305 of the main body 303.

Figure 32:
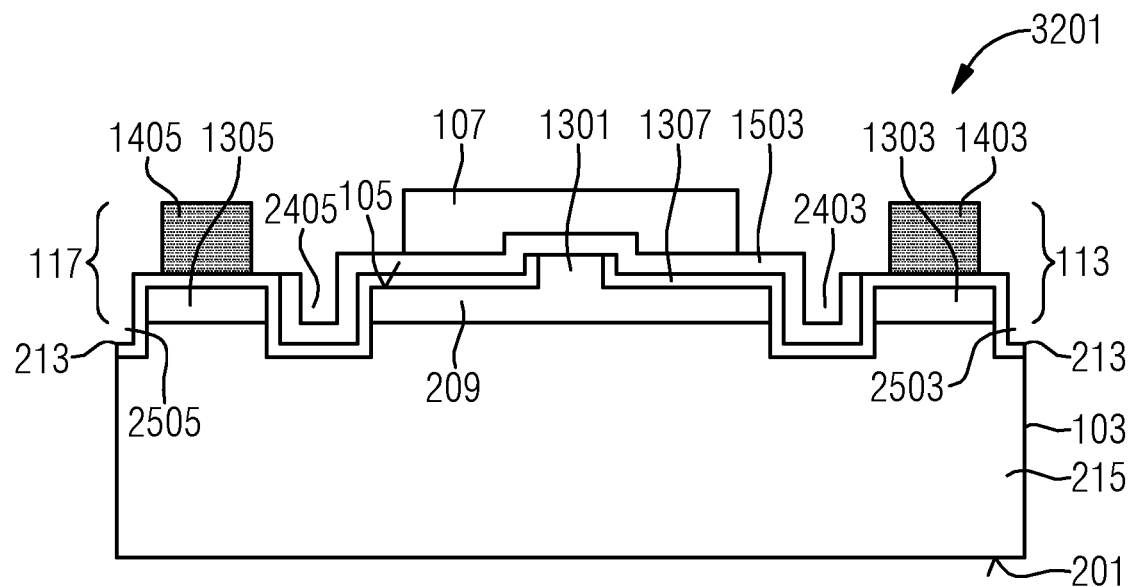
FIG. 32 shows an optoelectronic lighting device with a solder.

FIG. 32 shows an optoelectronic lighting device 3201 in a cross-sectional view.

The lighting device 3201 is configured substantially analogously to the lighting device 2501 from FIG. 25.

As a difference, a wetting layer 1503 is also applied on the passivation layer 1307. However, the wetting layer 1503 does not cover the complete passivation layer 1307, but rather only a region of the passivation layer 1307 extending from one of the mesa trenches 2405, 2403 to the other of the two mesa trenches 2403, 2405. A wetting layer 1503 is thus also provided below the solder 107.

Figure 33:
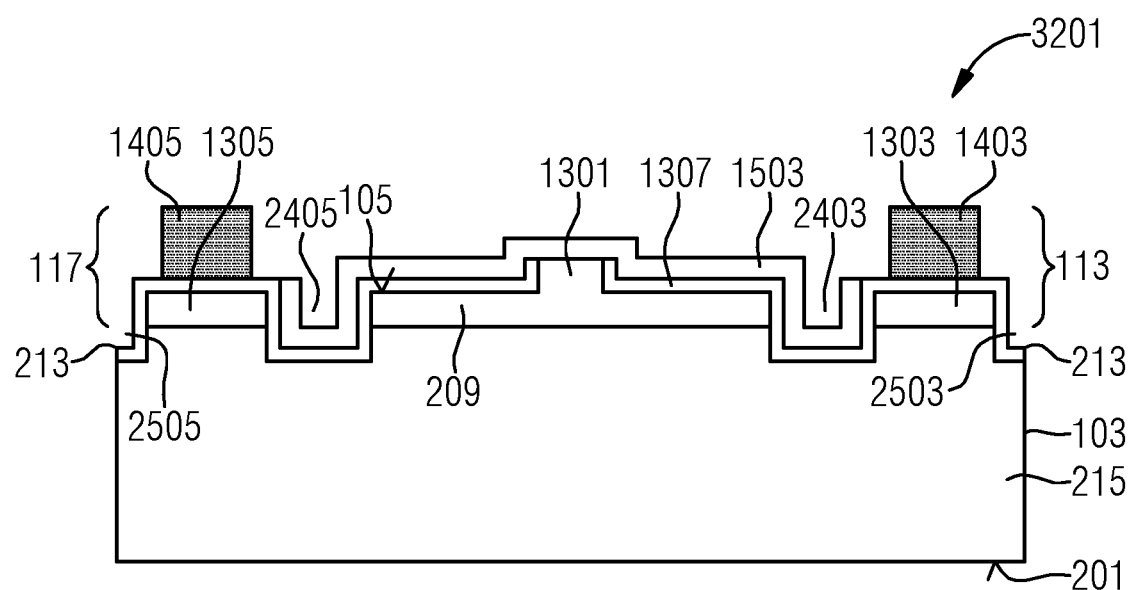
FIG. 33 shows the optoelectronic lighting device from FIG. 32 without the solder.

FIG. 33 shows the optoelectronic lighting device 3201 in accordance with FIG. 32, but without the solder 107.

In particular, an inner side of the trough may be lined at least partly, in particular completely, with a wetting layer, which is a metallic wetting layer, for example, for the solder. Particularly if the solder is applied on the mounting side of the main body, it is expedient to provide such a wetting layer. This is because this advantageously brings about a better mechanical stability of a soldering connection.

Figure 34:
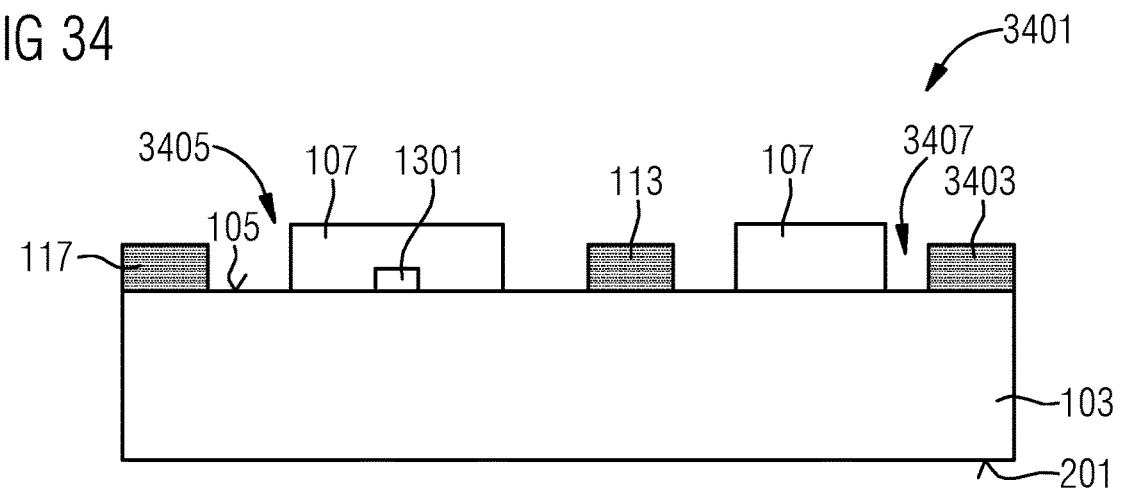
FIG. 34 shows an optoelectronic lighting device comprising a multipartite trough as solder barrier.

FIG. 34 shows an optoelectronic lighting device 3401 in a cross-sectional view.

In addition to the lateral walls 113, 117 shown previously, the solder barrier 109 also comprises a further wall 3403, wherein the further wall 3403 extends along the edge or outer edge of the top side 105. The one longitudinal wall 113 is arranged between the two walls 117, 3403.

The solder 107, as already described above, is located between the two walls 113, 117 and is thus received within a trough 3405 formed by the two walls 117, 113 and the top side 105.

On account of the further wall 3403 being provided, a second trough 3407 formed by the two walls 113, 3403 and the top side 105 is formed. Further solder 107 is received within the trough, the further solder bringing about an improved mechanical stabilization in the soldered state.

Figure 35:
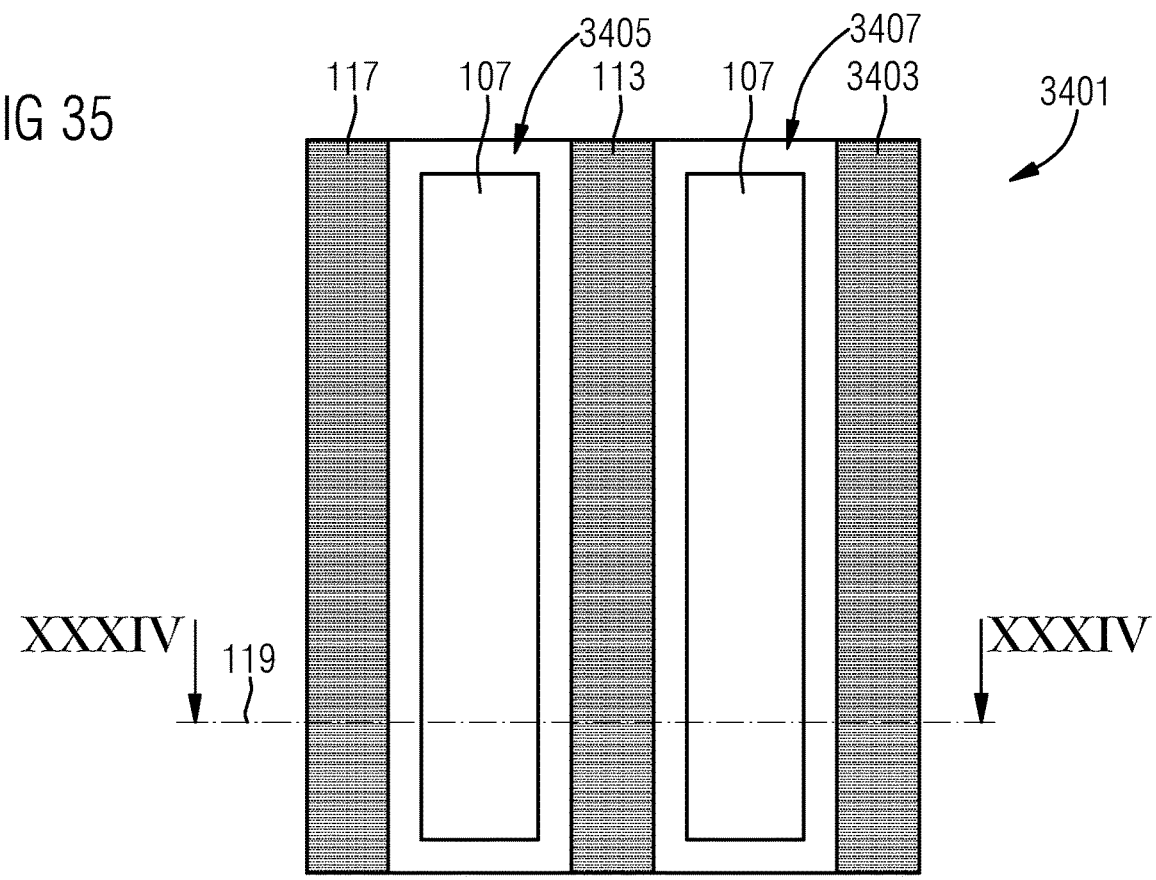
FIGS. 35 to 37 each show a different configuration of a multipartite trough such as may be used for an optoelectronic lighting device.

FIG. 35 shows a plan view of the lighting device 3401 in accordance with FIG. 34. A sectional line 119 (XXXIV-XXXIV) is depicted, wherein FIG. 34 shows a cross-sectional view along the sectional line 119 (XXXIV-XXXIV) in accordance with FIG. 35.

The two troughs 3405, 3407 are each open at two opposite sides. This is analogous to the solder barrier shown in FIGS. 20 and 21.

Figure 36:
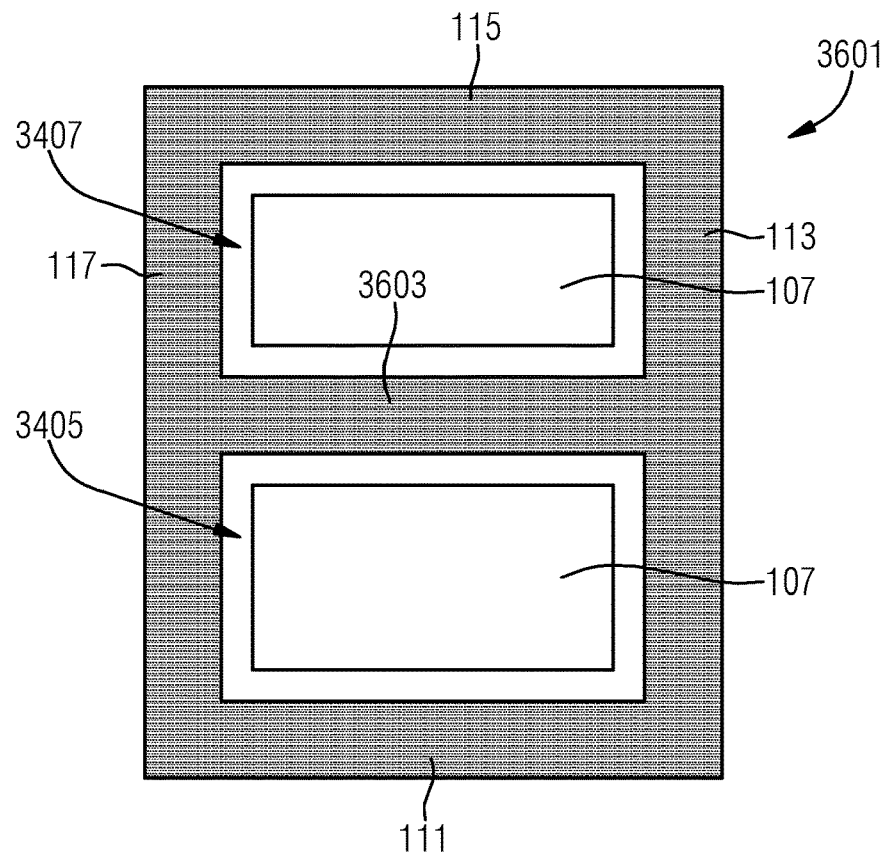
Figure 37:
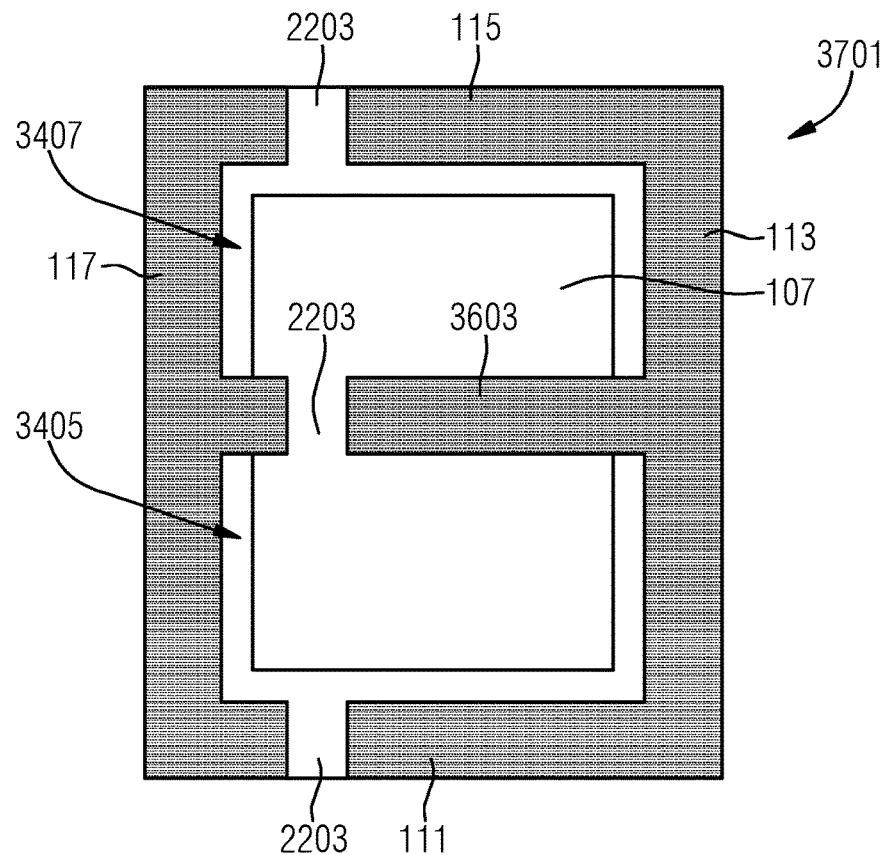

FIGS. 36 and 37 each show a simplified plan view of an optoelectronic lighting device 3601 and respectively 3701 comprising different configurations of two troughs for the solder.

FIG. 36 thus shows the optoelectronic lighting device 3601, wherein a further transverse wall 3603 is provided, which connects the wall 117 to the wall 113. Consequently, the original rectangle is thus subdivided into two smaller rectangles by the wall 3603 such that these subdivided rectangles respectively form a trough 3405, 3407. Solder 107 is arranged within each trough 3405, 3407.

The solder barrier 109 of the lighting device 3601 in accordance with FIG. 36 thus comprises two troughs 3405, 3407, which are completely separated from one another. This is done by the wall 3603.

This therefore affords the technical advantage, for example, that during soldering solder 107 is prevented from being able to flow from one trough to the other trough or into the other trough. A shunt between electrical contacts that are each located within one of the troughs is advantageously prevented as a result.

FIG. 37 shows an optoelectronic lighting device 3701 in a simplified plan view.

The lighting device 3701 is configured substantially analogously to the lighting device 3601 in accordance with FIG. 36.

As a difference, the transverse wall 3603 is not formed continuously, but rather comprises a gap 2203. The two troughs 3405, 3407 are thus not completely separated from one another.

Figure 38:
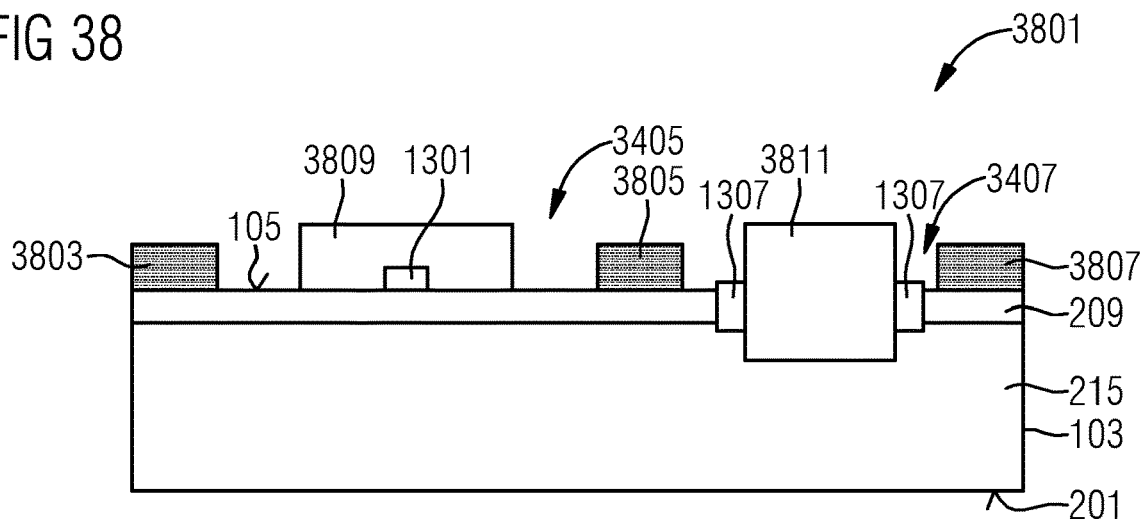
FIG. 38 shows an optoelectronic lighting device.

FIG. 38 shows an optoelectronic lighting device 3801 in a cross-sectional view.

Two contacts are formed or configured as the top side 105 of the semiconductor chip 103: a p-type contact 3809 and an n-type contact 3811. The p-type contact 3809 thus contacts a p-conducting semiconductor layer of the semiconductor layer sequence 209. The n-type contact 3811 contacts an n-conducting semiconductor layer of the semiconductor layer sequence 209. The n-type contact 3811 thus extends through the semiconductor layer sequence 209 and is provided laterally with a passivation layer 1307 to not contact the p-conducting semiconductor layer of the semiconductor layer sequence 209.

Consequently, the semiconductor chip 103 is thus completely contacted from the top side 105.

The lighting device 3801 comprises a solder barrier comprising two troughs 3405, 3407 analogously to the solder barrier comprising the two troughs in accordance with the lighting device 3401 in accordance with FIG. 34.

The p-type contact 3809 is received within the trough 3405. The n-type contact 3811 is received within the trough 3407.

Figure 39:
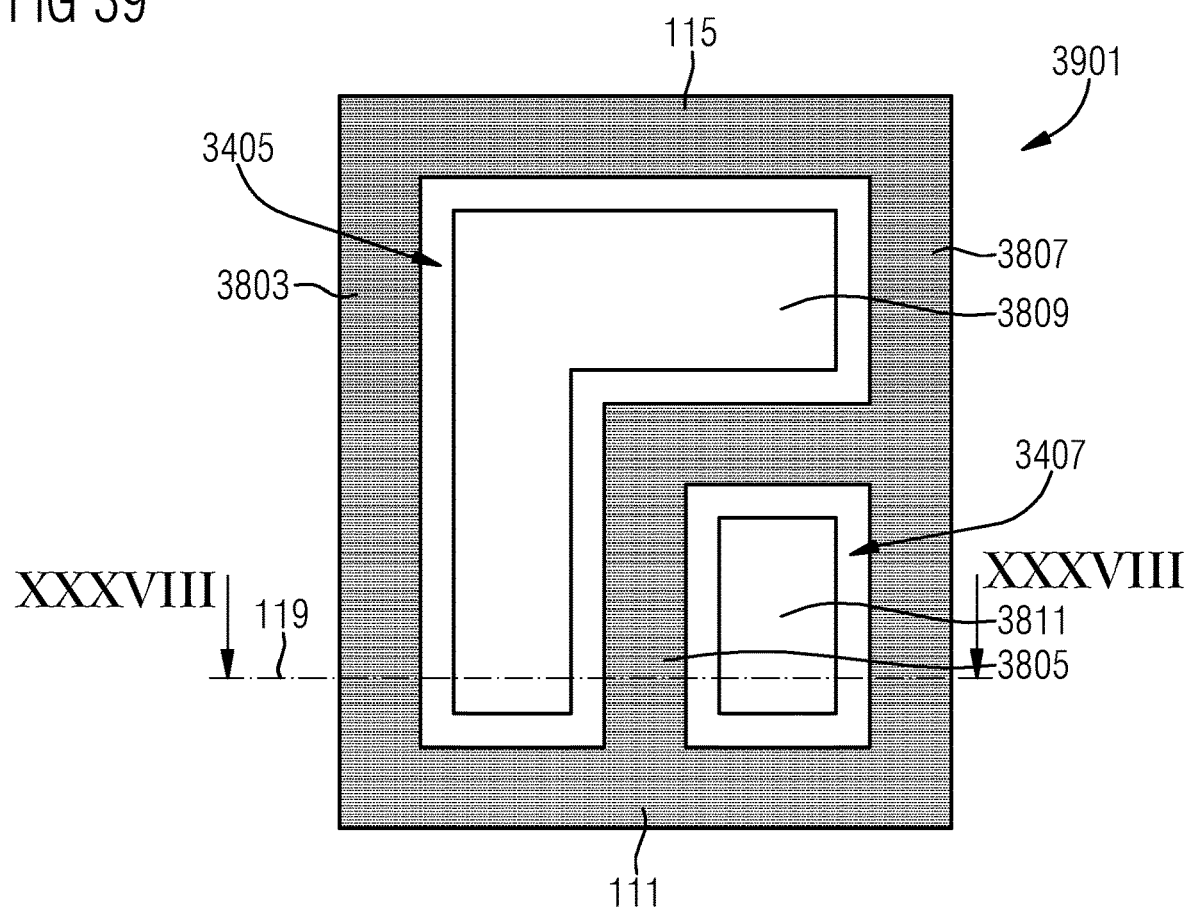
FIGS. 39 and 40 each show a different configuration of a solder barrier comprising two troughs such as may be used for the optoelectronic lighting device from FIG. 38.
Figure 40:
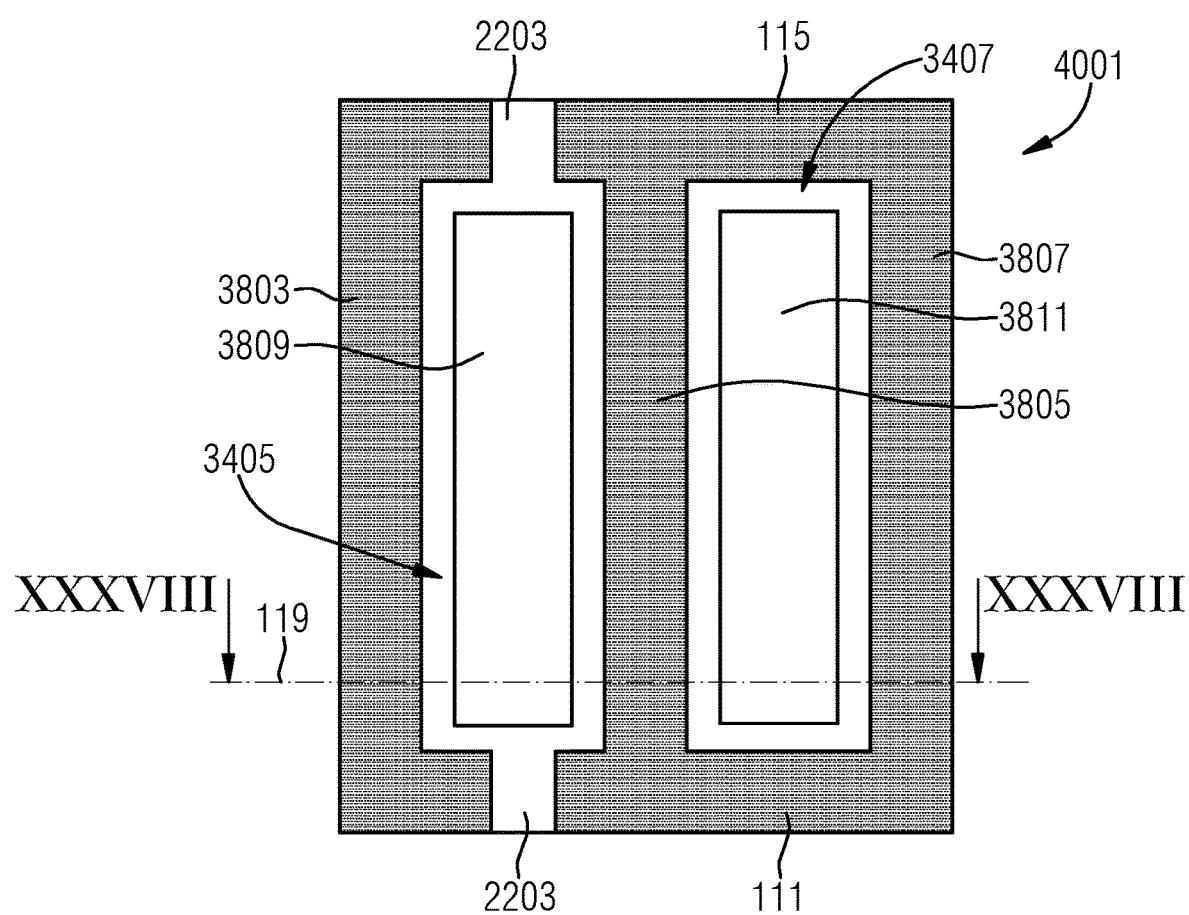

FIGS. 39 and 40 each show a simplified plan view of an optoelectronic lighting device 3910 and respectively 4001. A sectional line 119 (XXXVIII-XXXVIII) is depicted in each case, wherein FIG. 38 shows a cross-sectional view corresponding to the sectional line 119 (XXXVIII-XXXVIII).

In this regard, FIG. 39 shows the optoelectronic lighting device 3901, wherein here the solder barrier in accordance with this example comprises two troughs 3405, 3407 separated from one another.

In accordance with the lighting device 4001 in FIG. 40, the trough 3405 is open at two opposite sides insofar as gaps 2203 are formed at the corresponding transverse walls.

The wall with the reference signs 3803 and respectively 3805 and respectively 3807 as shown in FIGS. 38 to 40 substantially corresponds to the walls 117 and respectively 113 and respectively 3403 of the solder barrier in accordance with the lighting device 3401 from FIG. 34.

FIG. 41 shows an optoelectronic lighting device 4101.

The lighting device 4101 comprises a plurality of semiconductor chips configured as lasers 4103. The plurality of lasers 4103 form a laser bar 4105. An underside 4107 of the laser bar 4105 is formed by the respective undersides of the lasers 4103.

The laser bar 4105 comprises at its underside 4107 a solder barrier 109 comprising, analogously to the solder barrier 109 in accordance with the lighting device 101 in accordance with FIG. 1, a trough formed from the four walls 111, 113, 115, 117 and the underside 4107. Solder 107 is provided or received within the trough.

FIG. 42 shows an optoelectronic lighting device 4201 in a simplified plan view.

The lighting device 4201 is configured substantially analogously to the lighting device 4101 from FIG. 41.

As a difference, three troughs 4205, 4207, 4209 are formed. This is done in particular by the original rectangle in accordance with FIG. 41, formed from the four walls 111, 113, 115, 117 being subdivided into three troughs by two transverse walls 4203. Three lasers 4103 are received in each of the three troughs 4205, 4207, 4209, the lasers each being provided with a solder 107, wherein the respective solder 107 of the individual lasers 4103 is spaced apart from one another.

On a laser bar all the emitters (lasers) may be arranged within a single trough. This enables, for example, a good thermal linking of the lasers among one another and in particular to a heat sink.

Each laser may obtain its own trough, that is to say that the solder of a laser is received in a dedicated trough.

A plurality of lasers may be combined in groups within a respective trough. Thermal crosstalk between the lasers may advantageously be influenced as a result.

Figure 43:
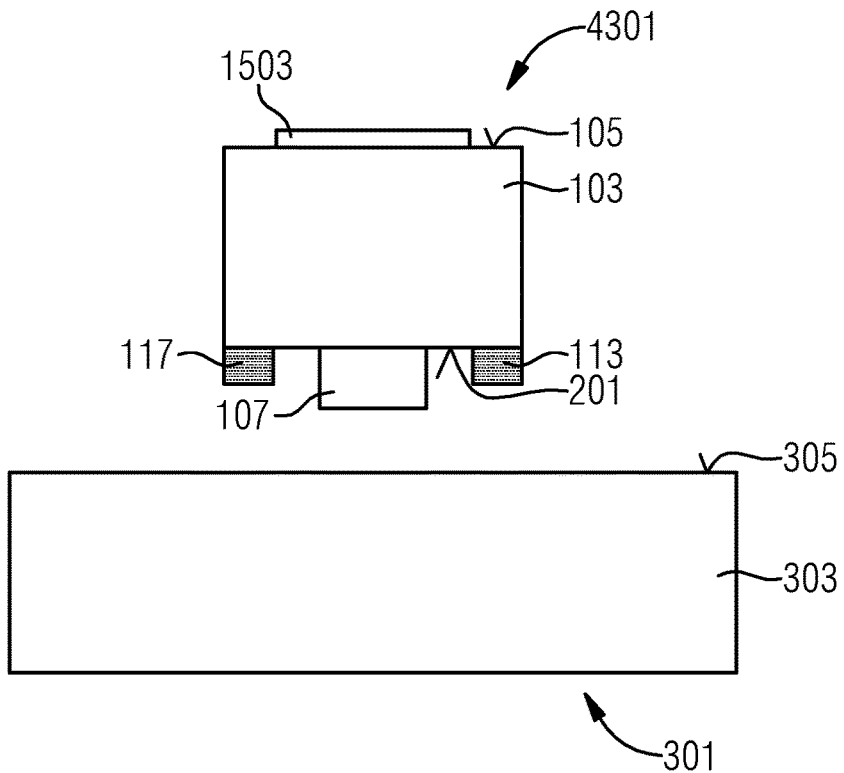
FIG. 43 shows an optoelectronic lighting device.

FIG. 43 shows an optoelectronic lighting device 4301 in a cross-sectional view. The solder barrier comprising the walls 113, 117 is arranged at the underside 201, which is the n-side, for example. Consequently, the solder 107 is arranged at the underside 201 of the semiconductor chip 103 in the correspondingly formed trough.

The wetting layer 1503 is provided at the top side 105 of the semiconductor chip 103, which is the p-side, for example.

The lighting device 4301 is thus arranged by the underside 201 of the semiconductor chip 103 onto the mounting side 305 of the main body 303 of the carrier 301.

Figure 44:
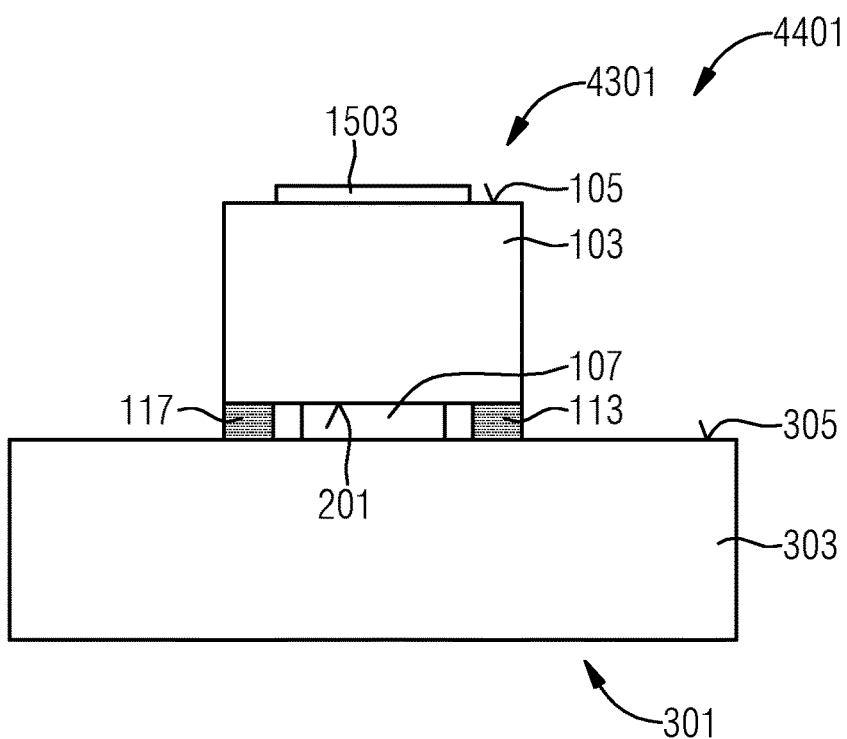
FIG. 44 shows an optoelectronic lighting system.

FIG. 44 shows the lighting device 4301 in a soldered state. That is to say that the semiconductor chip 103 is soldered by the underside 201 on the mounting surface 305.

FIG. 44 thus shows an optoelectronic lighting system 4401 in accordance with one example.

All examples described in the context of this description may also be embodied on an n-side of a semiconductor chip. It is true that soldering the n-side onto a solder surface or mounting side is generally not as critical with regard to shunts as soldering the p-side onto the mounting surface. Nevertheless, the trough or generally the solder barrier will advantageously also be used to the effect that the solder 107 remains in a defined manner below the semiconductor chip, in particular below the laser, and does not flow laterally.

Particularly in soft solder mounting (for example, if the solder comprises indium), an aging stability can thus also advantageously be increased since the solder may not creep up the lateral wall of the semiconductor chip. Moreover, providing a solder barrier that simultaneously also acts as a spacer increases a vertical position accuracy.

Figure 45:
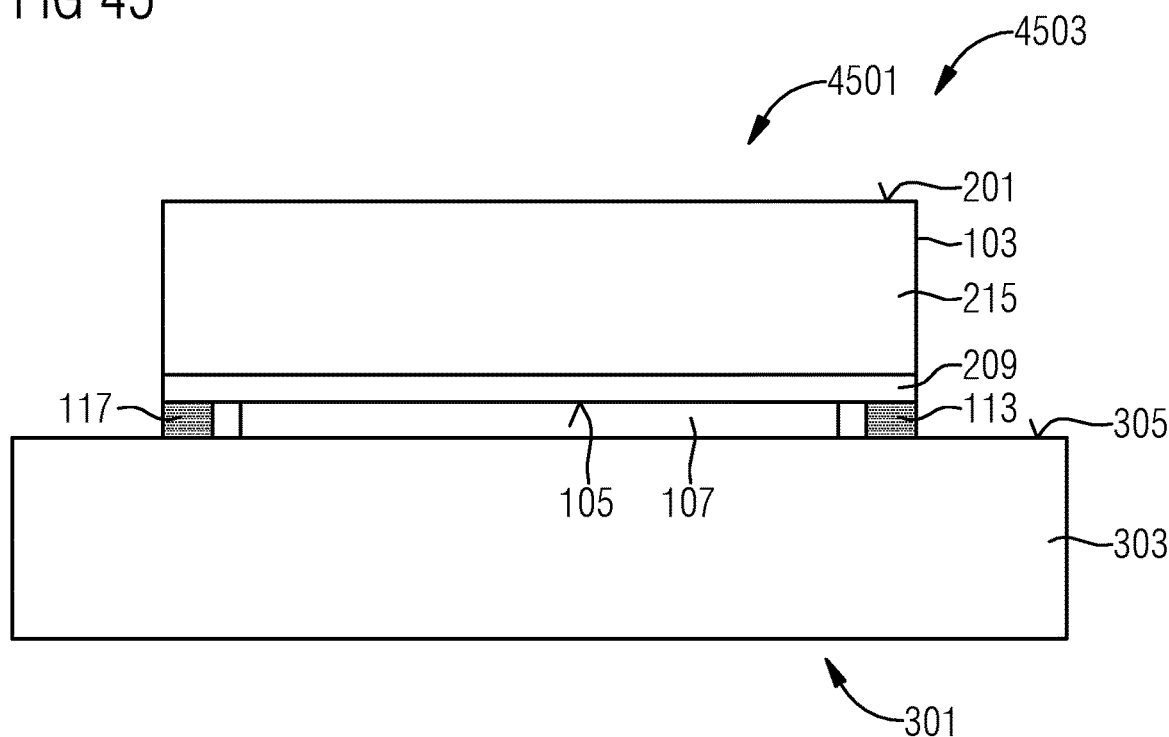
FIGS. 45 and 46 each show an optoelectronic lighting system.

FIG. 45 shows an optoelectronic lighting device 4503 in a simplified cross-sectional view after having been soldered on a carrier 301. FIG. 45 thus shows an optoelectronic lighting system 4501 in accordance with one example.

The semiconductor chip 103 in accordance with the lighting device 4503 in FIG. 45 is, for example, a light emitting diode chip (LED chip). The underside 201 is the p-side, for example. The top side 105 of the chip 103 of the lighting device 4503 is the n-side, for example.

Figure 46:
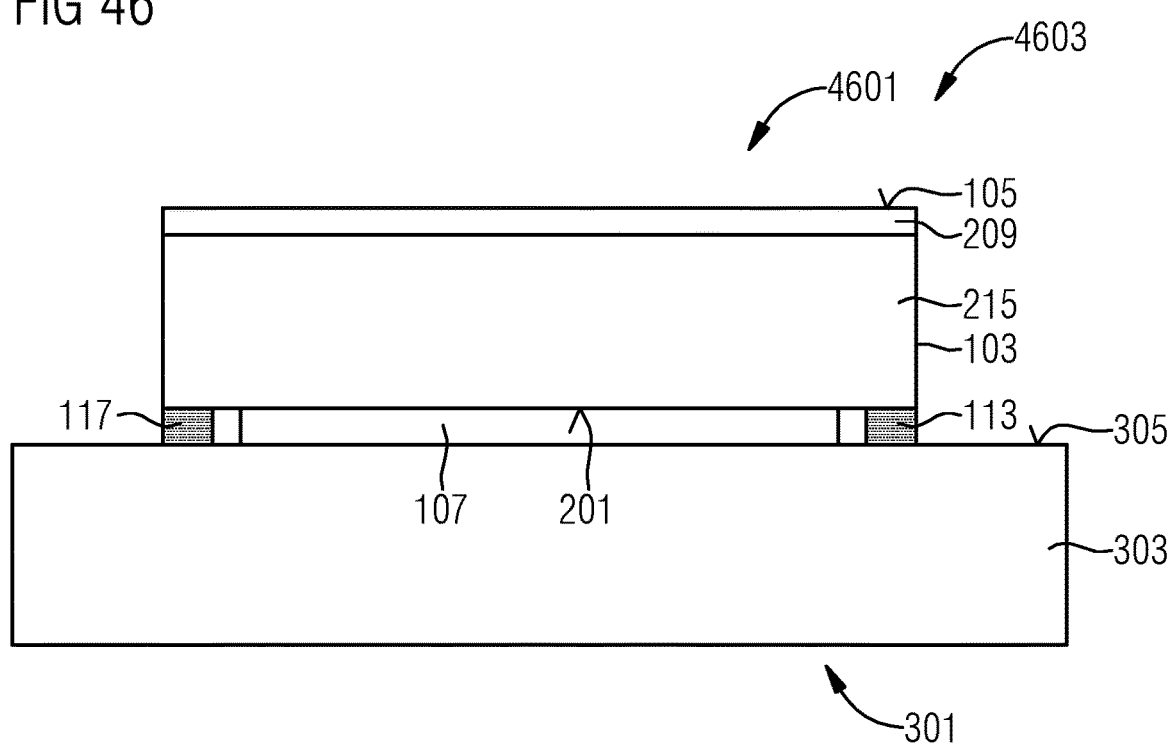

FIG. 46 shows an optoelectronic lighting system 4601 in accordance with one example.

The lighting system 4601 comprises an optoelectronic lighting device 4603, wherein here the top side 105 is the n-side, and the underside 201 of the semiconductor chip 103 is the p-side. The semiconductor chip 103 is an LED chip, for example.

Instead of or in addition to the solder 107, by way of example, an adhesive, in particular an electrically conductive adhesive, is provided. If an adhesive that is not electrically conductive is used, the semiconductor chip may be and/or respectively has been electrically connected or electrically contacted by bond wires.

The concept of the solder barrier may also be used in light emitting diode semiconductor chips. Such a solder barrier, which may comprise a trough, for example, advantageously prevents solder and/or an adhesive, for example, an electrically conductive adhesive, from welling up below the semiconductor chip and wetting the lateral walls of the LED semiconductor chip.

As a result, a better emission behavior may furthermore advantageously be achieved because the lateral walls are not covered with nontransparent material (solder and/or adhesive). Moreover, an aging stability is advantageously increased since no solder and/or adhesive may creep up the lateral walls and short-circuit the p-n junction of the semiconductor chip.

The semiconductor chips described in the context of this description may be LED semiconductor chips and/or semiconductor laser chips.

Consequently, the same examples as have been described for semiconductor laser chips are possible in principle in LED semiconductor chips. A semiconductor laser chip is, for example, generally configured as a laser diode.

Figure 47:
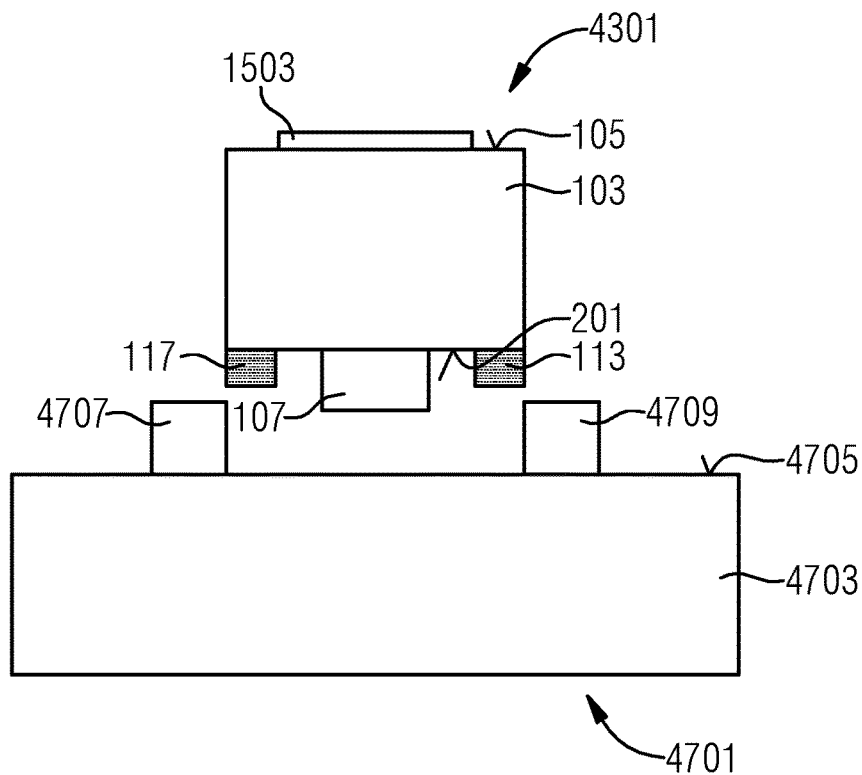
FIG. 47 shows a carrier for an optoelectronic lighting device and the optoelectronic lighting device from FIG. 43.

FIG. 47 shows the optoelectronic lighting device 4301 in accordance with FIG. 43 in the course of arranging onto a main body 4703 of a carrier 4701 for an optoelectronic semiconductor chip. The main body 4703 comprises a mounting surface or mounting side 4705. The semiconductor chip 103 is arranged by its underside 201 onto the mounting surface 4705.

The mounting surface 4705 comprises two opposite stops 4707, 4709. That is to say therefore, in particular, that two mutually opposite stops 4707, 4709 are configured or formed at the mounting surface 4705. The two stops 4707, 4709 are thus configured in particular as elevations of the mounting surface 4705.

A width or a distance between the two stops 4707, 4709 is dimensioned such that the width or distance corresponds to a width of the semiconductor chip 103. An efficient lateral alignment is thus advantageously made possible. This is because the walls 117, 113 are used here for this alignment insofar as they strike the opposite stops 4707, 4709 in the course of arranging and thus bring about an efficient lateral alignment or guidance in the course of arranging.

Figure 48:
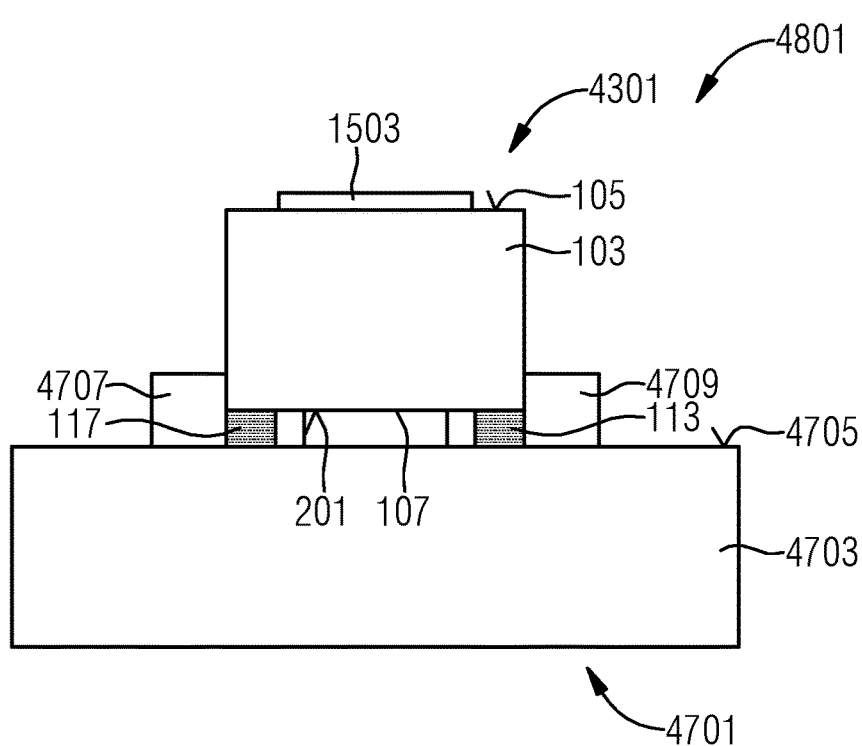
FIG. 48 shows an optoelectronic lighting system.

FIG. 48 shows the lighting device 4301 in the soldered state. That is to say that the semiconductor chip 103 has been soldered onto the mounting surface 4705. FIG. 48 thus shows an optoelectronic lighting system 4801 in accordance with one example.

Figure 49:
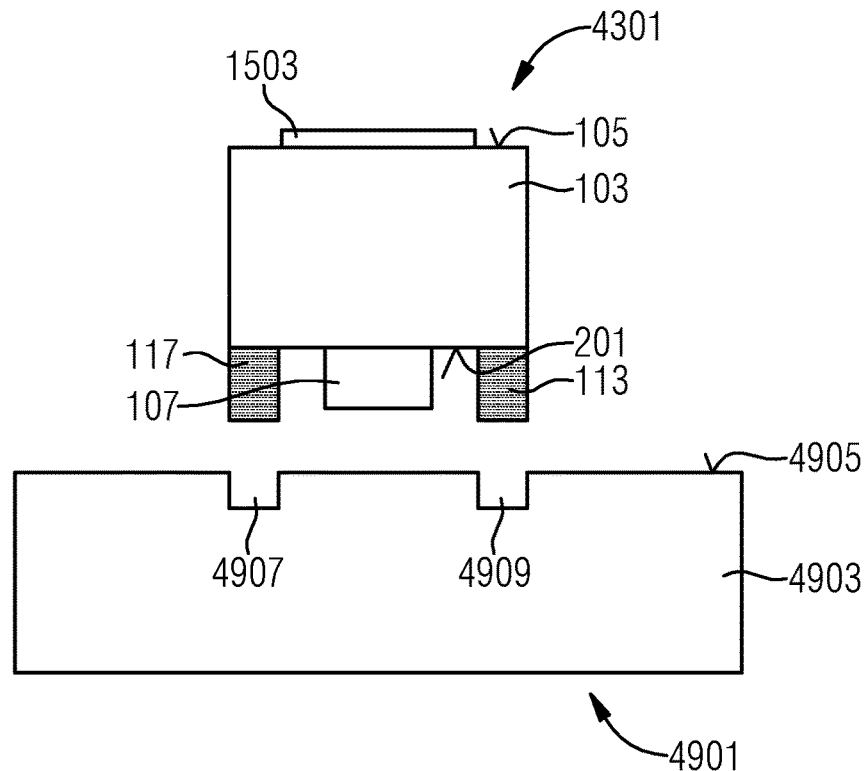
FIG. 49 shows a carrier for an optoelectronic lighting device and the optoelectronic lighting device from FIG. 43.

FIG. 49 shows the optoelectronic lighting device 4301 in accordance with FIG. 43 in the course of arranging onto a carrier 4901. The carrier 4901 comprises a main body 4903 comprising a mounting surface 4905.

Two depressions 4907, 4909 are formed at the mounting surface 4905. The depressions 4907, 4909 are dimensioned and spaced apart from one another such that they may respectively receive one of the walls 117, 113 of the solder barrier 109 of the semiconductor chip 103.

Consequently, an efficient lateral alignment and orientation are thus achieved and/or respectively effected in the course of arranging the semiconductor chip 103 onto the mounting surface 4905 of the main body 4903.

Figure 50:
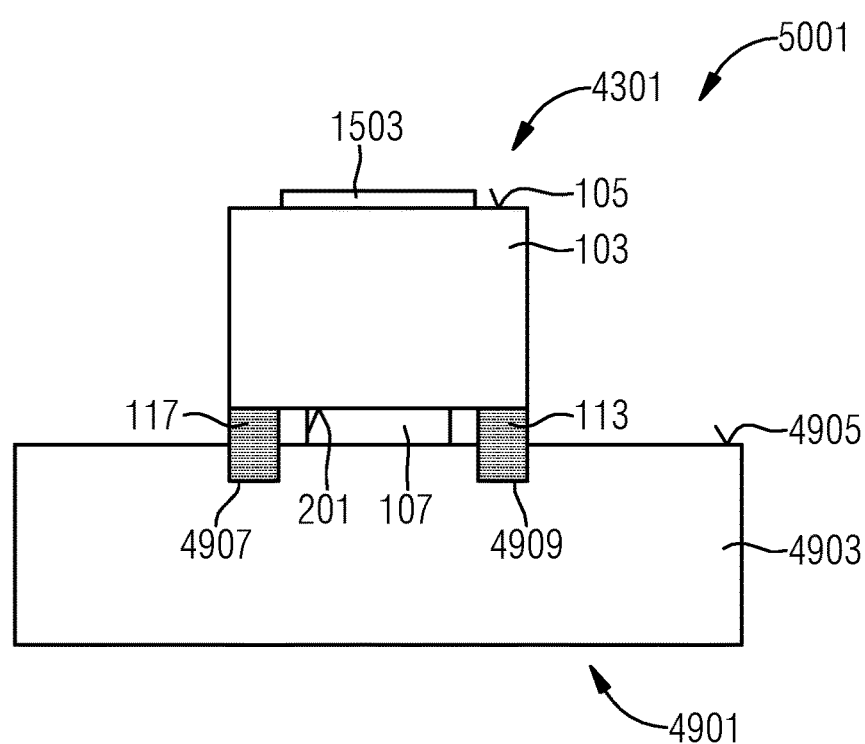
FIG. 50 shows an optoelectronic lighting system.

FIG. 50 shows the lighting device 4301 in the soldered state. The semiconductor chip 103 is soldered on the carrier 4901 by the solder 107.

FIG. 50 thus shows an optoelectronic lighting system 5001 in accordance with one example.

Figure 51:
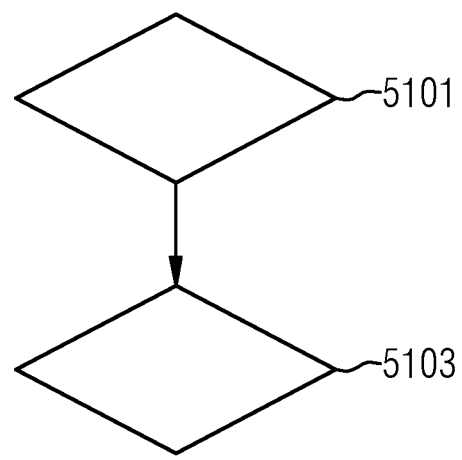
FIG. 51 shows a flow diagram of a method of producing an optoelectronic lighting device.

FIG. 51 shows a flow diagram of a method of producing an optoelectronic lighting device.

The method comprises the following steps:
providing 5101 an optoelectronic semiconductor chip, which comprises a top side and an underside opposite the top side, wherein a semiconductor layer sequence is formed between the top side and the underside, wherein the semiconductor layer sequence comprises an active zone that generates electromagnetic radiation, forming 5103 at one of the top side and the underside a barrier, in particular a solder barrier, for a bonding material in particular solder and/or adhesive, flowing on account of cohesive bonding, in particular soldering and/or adhesive bonding, of the semiconductor chip to a carrier.

Figure 52:
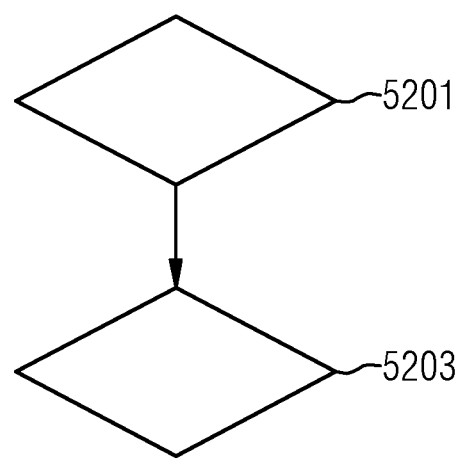
FIG. 52 shows a method of producing a carrier for an optoelectronic semiconductor chip.

FIG. 52 shows a flow diagram of a method of producing a carrier for an optoelectronic semiconductor chip.

The method comprises a step of providing 5201 a main body comprising a mounting side. The method comprises a step of forming 5203 a barrier, for example, a solder barrier, for a bonding material, in particular solder and/or adhesive, flowing on account of cohesive bonding, in particular soldering and/or adhesive bonding, of the semiconductor chip to the carrier, at the mounting side of the main body.

To summarize, the basic concept should be seen, for example, in the fact that a trough is provided at the p- and/or respectively n-side of a semiconductor chip, the trough preventing, by its lateral walls, solder during soldering and/or respectively adhesive during adhesive bonding from flowing beyond the chip edge. As a result, by way of example, shunts at the chip edge may advantageously be prevented.

One or a plurality of walls of the solder barrier may be formed from one or from a plurality of layers of the semiconductor layer sequence.

Such a layer of the semiconductor layer sequence which at least partly, in particular completely, forms the wall or the walls of the solder barrier may comprise a metal, a semiconductor, a dielectric or dielectrics and/or one or more polymers (for example, BCB). BCB stands for benzocyclobutene, which is used, for example, as passivation and/or for planarization in semiconductor technology.

One or a plurality of walls of the solder barrier have been and/or respectively may be patterned by a patterning method, for example, by a photolithography method.

One or a plurality of lateral walls may each comprise a distance with respect to the solder such that the solder has room or space for expansion and/or respectively flowing in the context of a soldering process. The volume within the trough may be chosen such that it corresponds for instance to the solder volume.

In examples comprising a plurality of troughs, it is thus provided, for example, that solder is provided in each trough. That is to say that the trough consists of a plurality of segments, the individual troughs. The trough is thus subdivided into (sub-)troughs. This leads to an increased mechanical stability that leads to an increased mechanical stability, for example, in semiconductor chips (power lasers or LEDs) of corresponding size.

Secondly, such a configuration makes it possible to embody a plurality of contacts on a same side of the semiconductor chip (for example, by a via hole technique). The troughs/intermediate walls prevent a shunt from being able to form between the contacts in the case of p-down mounting.

Figure 53:
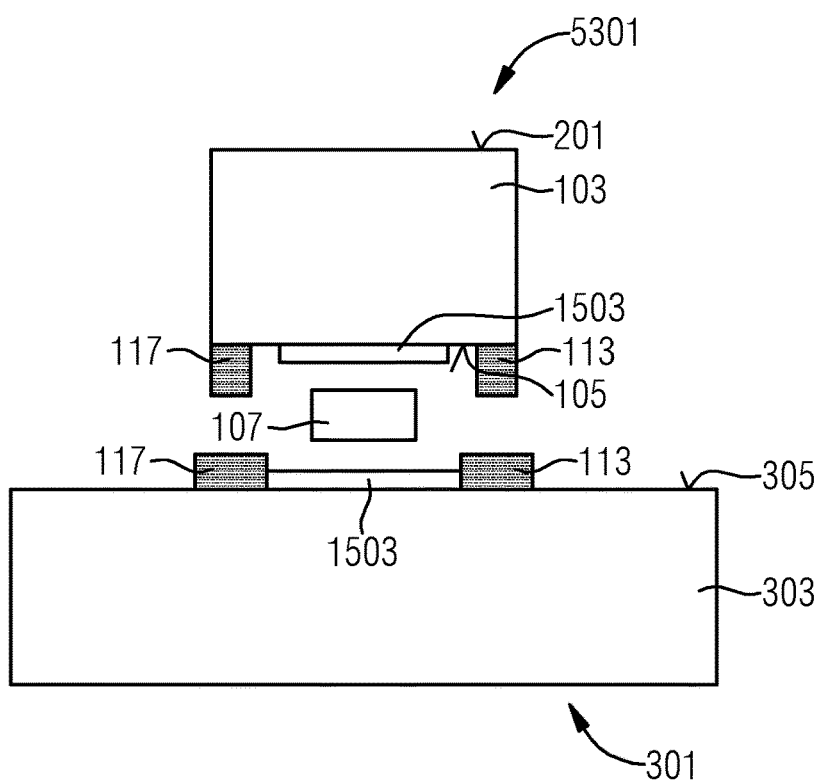
FIG. 53 shows an optoelectronic lighting device before soldering onto a carrier.

FIG. 53 shows an optoelectronic lighting device 5301 in a cross-sectional view.

Instead of solder 107, a wetting layer 1503 is provided on the top side 105 of the semiconductor chip 103. Analogously to the lighting device 101 from FIG. 1, the lighting device 5301 comprises a solder barrier comprising a plurality of walls 111, 113, 115, 117, wherein only the two opposite walls 117, 113 may be seen on account of the cross-sectional view.

The semiconductor chip 103 of the lighting device 5301 is arranged onto a carrier 301 comprising a main body 303 comprising a mounting side 305. This is done by soldering and/or adhesive bonding. Adhesive, for example, is provided instead of or in addition to the solder 107.

A solder barrier comprising a plurality of walls is likewise provided on the mounting side 305 of the main body 303 of the carrier 301, wherein only the two opposite walls 113, 117 may be seen in accordance with the cross-sectional view. The carrier 301 in FIG. 53 is configured, for example, substantially analogously to the carrier 301 from FIG. 30.

Between the two walls 113, 117 of the solder barrier of the carrier 301, a wetting layer 1503 is likewise applied on the mounting side 305.

Both the semiconductor chip 103 and the carrier 301 are each provided with a solder barrier. As a result, a volume for a solder and/or an adhesive is advantageously increased in an efficient manner.

Solder 107 is symbolically depicted between the carrier 301 and the lighting device 5301. This is intended in particular to symbolize that, for example, provision is made for the solder 107 to be applied on the wetting layer 1503 of the carrier 301. By way of example, instead or in addition provision is made for solder 107 to be applied on the wetting layer 1503 of the semiconductor chip 103.

Both the semiconductor chip 103 and the main body 303 are provided with a wetting layer 1503.

Figure 54:
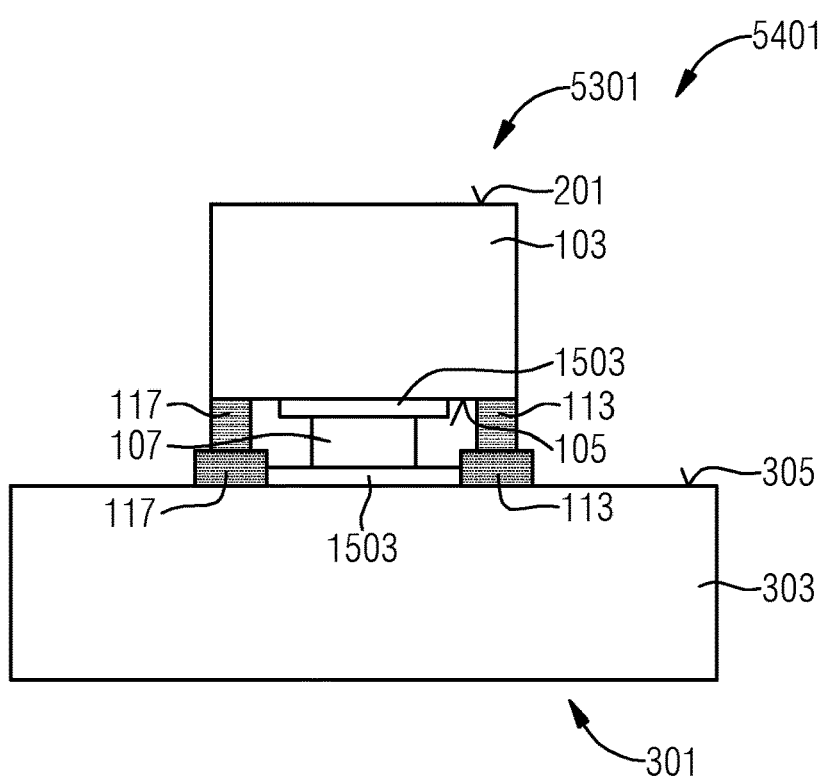
FIG. 54 shows an optoelectronic lighting system.

FIG. 54 shows the optoelectronic lighting device 5301 in the arranged state on the carrier 301. FIG. 54 thus shows an optoelectronic lighting system 5401 in accordance with one example.

Figure 55:
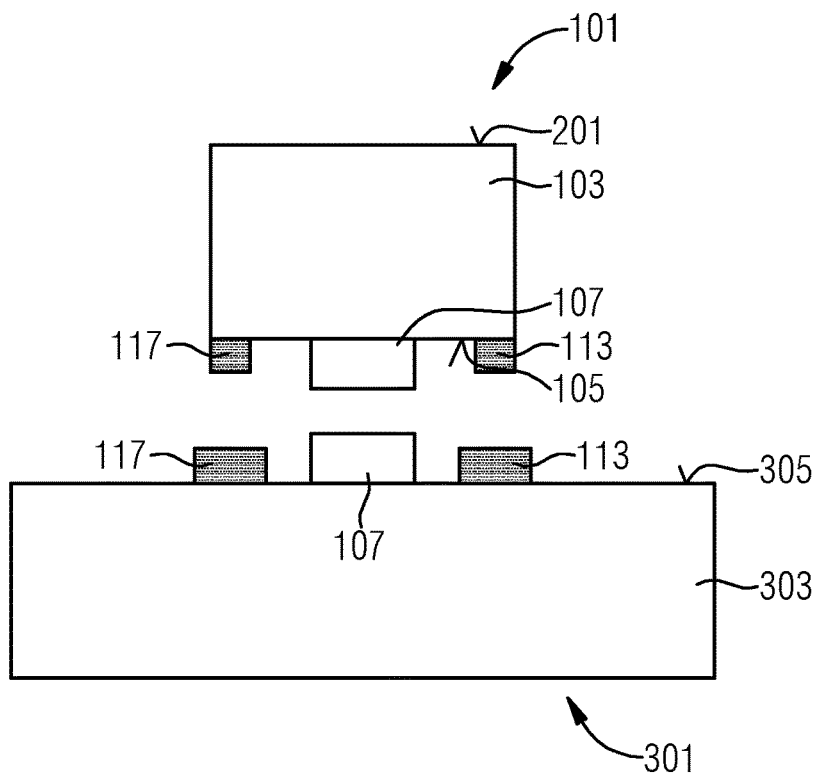
FIGS. 55 to 57 each show an optoelectronic lighting device before soldering onto a carrier.
Figure 56:
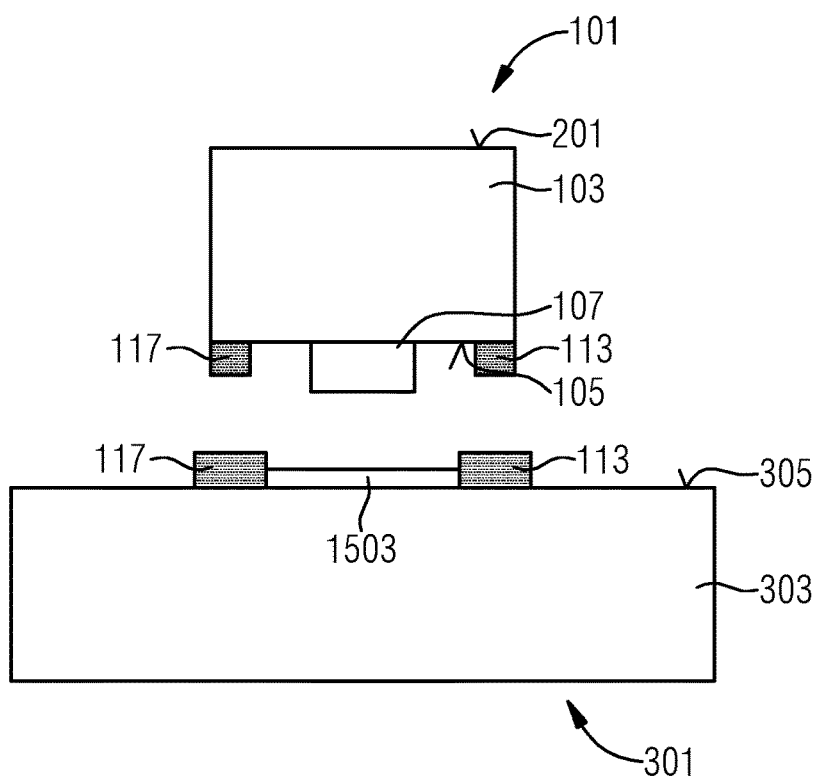
Figure 57:
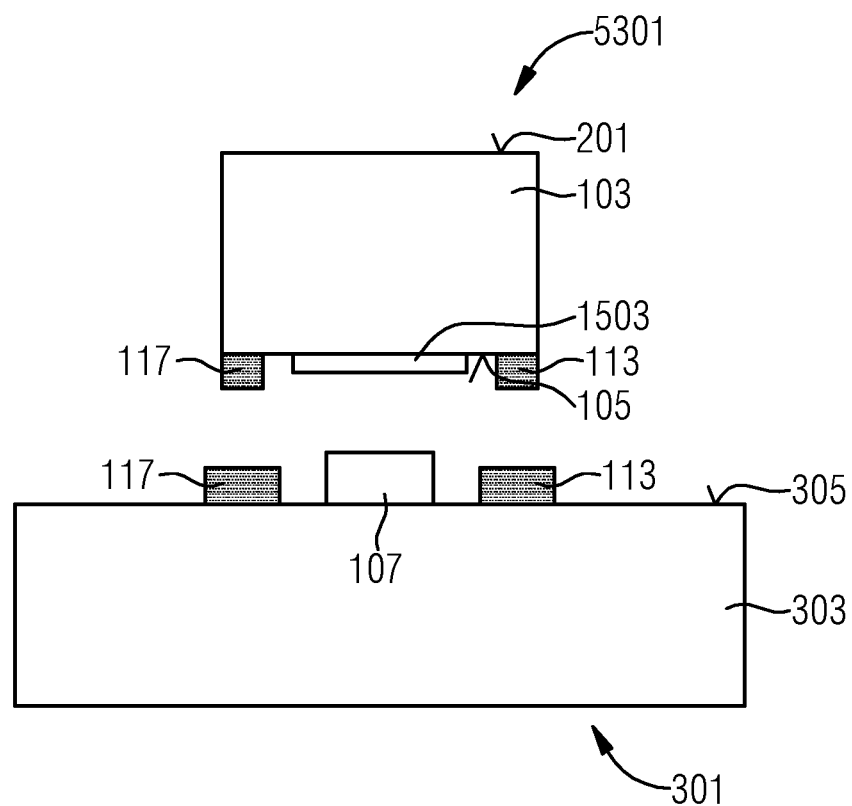

FIGS. 55 to 57 each show an optoelectronic lighting device before arranging onto a carrier 301.

In the examples shown in FIGS. 55 to 57, analogously to the example in accordance with FIG. 53, both the chip 103 and the main body 303 are each provided with a solder barrier.

In accordance with the example in FIG. 55, the optoelectronic lighting device 101 in accordance with FIG. 1 is soldered and/or adhesively bonded onto the carrier 301. Both the top side 105 of the semiconductor chip 103 and the mounting side 305 of the main body 303 of the carrier 301 are each provided with solder 107. Consequently, in particular solder 107 and/or adhesive are/is located both on the semiconductor chip 103 and on the main body 303. Both the carrier 301 and the semiconductor chip 103 comprise solder 107 and/or (in an example not shown) adhesive.

In accordance with the example in FIG. 56, only the top side 105 of the semiconductor chip 103 comprises solder 107. The mounting side 305 of the main body 303 of the carrier 301 is provided with a wetting layer 1503 between the walls 117, 113 analogously to the arrangement shown in FIG. 53.

In accordance with the arrangement shown in FIG. 56, only the semiconductor chip 103 is provided with solder 107 and/or (in an example not shown) adhesive. The mounting side 305 is only provided with a wetting layer 1503.

FIG. 57 shows an opposite configuration relative to FIG. 56. Here, the wetting layer 1503 is provided on the top side 105 of the semiconductor chip 103. The mounting side 305 of the main body 303 of the carrier 301 is provided with solder 107. Consequently, thus only the main body is provided with a solder 107 and/or (in an example not shown) an adhesive, whereas the semiconductor chip 103 is provided only with the wetting layer 1503.

By virtue of the fact that both the semiconductor chip and the main body of the carrier may each be provided with a solder barrier, an enclosed volume of the troughs formed by the respective solder barriers is enlarged. If the two troughs are then placed one on top of another, the corresponding volumes of the respective troughs are added.

If the respective barriers of the carrier and of the semiconductor chip comprise one or a plurality of walls, then according to one example, in the course of arranging the semiconductor chip onto the carrier, the walls will combine to form one wall or to form a plurality of walls. This/these combined wall/walls may thus be formed from the walls of the carrier and of the semiconductor chip. The wall or the walls of the carrier and/or respectively of the semiconductor chip may thus be referred to as parts of the combined wall and/or respectively of the combined walls.

Although our devices, carriers, systems and methods have been more specifically illustrated and described in detail by preferred examples, nevertheless this disclosure is not restricted by the examples disclosed and other variants may be derived therefrom by those skilled in the art, without departing from the scope of protection of the appended claims.

This application claims priority of DE 10 2016 103 862.8, the subject matter of which is incorporated herein by reference.

The invention claimed is:

1. An optoelectronic lighting device, comprising:
an optoelectronic semiconductor chip comprising a top side and an underside opposite the top side,
wherein a semiconductor layer sequence is formed between the top side and the underside,
the semiconductor layer sequence comprises an active zone that generates electromagnetic radiation,
a barrier for a bonding material flowing on account of cohesive bonding of the semiconductor chip to a carrier is formed at one of the top side and the underside,
the barrier comprises one or a plurality of walls such that at least one at least partly laterally closed trough that receives the flowing bonding material is formed by the one or the plurality of walls and the one of the top side and the underside, and
wherein two troughs are formed, in each case, an electrical contact for electrically contacting the semiconductor chip is arranged within the two troughs, and the two troughs are separated from one another by one or a plurality of closed walls to prevent formation of a shunt through the flowing bonding material between the two electrical contacts.

2. The optoelectronic lighting device according to claim 1, wherein the barrier is formed at least partly by the semiconductor layer sequence.

3. The optoelectronic lighting device according to claim 1, wherein the bonding material provided with a cover layer comprising gold is arranged at the one of the top side and the underside.

4. The optoelectronic lighting device according to claim 1, wherein the semiconductor chip is a laser, and the barrier is configured to be open at an HR side of the laser.

5. The optoelectronic lighting device according to claim 1, wherein the barrier comprises one or a plurality of gaps for escape of air during cohesive bonding.

6. The optoelectronic lighting device according to claim 1, wherein the semiconductor chip is a laser comprising a ridge waveguide, and the barrier is formed at a distance from the ridge waveguide.

7. A method of producing an optoelectronic lighting device, comprising:
providing an optoelectronic semiconductor chip comprising a top side and an underside opposite the top side, wherein a semiconductor layer sequence is formed between the top side and the underside, and the semiconductor layer sequence comprises an active zone that generates electromagnetic radiation,
forming at one of the top side and the underside a barrier for a bonding material flowing on account of cohesive bonding of the semiconductor chip to a carrier,
wherein forming the barrier comprises forming one or a plurality of walls such that at least one at least partly laterally closed trough that receives the flowing bonding material is formed by the one or the plurality of walls and the one of the top side and the underside, wherein two troughs are formed, in each case an electrical contact for electrically contacting the semiconductor chip is arranged within the two troughs, and the two troughs are separated from one another by one or a plurality of closed walls to prevent formation of a shunt through the flowing bonding material between the two electrical contacts.

8. The method according to claim 7, wherein the bonding material provided with a cover layer comprising gold is arranged at the one of the top side and the underside, forming the barrier comprises applying $SiO_2$ on the one of the top side and the underside such that the one of the top side and the underside including the cover layer is completely covered with $SiO_2$, and after the covering $SiO_2$ is selectively removed from the cover layer such that the barrier is formed at least partly by the remaining $SiO_2$.

9. An optoelectronic lighting device, comprising:
an optoelectronic semiconductor chip comprising a top side and an underside opposite the top side,
wherein a semiconductor layer sequence is formed between the top side and the underside,
the semiconductor layer sequence comprises an active zone that generates electromagnetic radiation,
a barrier for a bonding material flowing on account of cohesive bonding of the semiconductor chip to a carrier is formed at one of the top side and the underside,
wherein a plurality of optoelectronic semiconductor chips configured as lasers and forming a laser bar are provided, and wherein the undersides of the semiconductor chips form a common underside of the laser bar.

10. The optoelectronic lighting device according to claim 9, wherein the barrier comprises one or a plurality of walls such that a plurality of at least partly laterally closed troughs that receive the flowing bonding material is formed by the one or the plurality of walls and the underside, and the plurality of troughs are formed at the common underside of the laser bar, in each case one or a plurality of lasers being arranged within said troughs.

11. An optoelectronic lighting device, comprising:
an optoelectronic semiconductor chip comprising a top side and an underside opposite the top side,
wherein a semiconductor layer sequence is formed between the top side and the underside,
the semiconductor layer sequence comprises an active zone that generates electromagnetic radiation,
a barrier for a bonding material flowing on account of cohesive bonding of the semiconductor chip to a carrier is formed at one of the top side and the underside,
wherein one or a plurality of mesa trenches that receive the flowing bonding material are formed at the one of the top side and the underside, and,
wherein one of the one or the plurality of mesa trenches extends from a first facet of the semiconductor chip to a second facet opposite the first facet, the one mesa trench comprises two facet sections each adjoining one of the two facets and an intermediate section extending between the two facet sections, and a depth of the intermediate section is greater than a respective depth of the two facet sections.

12. A method of producing an optoelectronic lighting device, comprising:
providing an optoelectronic semiconductor chip comprising a top side and an underside opposite the top side, wherein a semiconductor layer sequence is formed between the top side and the underside, and the semiconductor layer sequence comprises an active zone that generates electromagnetic radiation,
forming at one of the top side and the underside a barrier for a bonding material flowing on account of cohesive bonding of the semiconductor chip to a carrier,
wherein one or a plurality of mesa trenches that receive the flowing bonding material are formed at the one of the top side and the underside, and
wherein one of the one or the plurality of mesa trenches extends from a first facet of the semiconductor chip to a second facet opposite the first facet, the one mesa trench comprises two facet sections each adjoining one of the two facets and an intermediate section extending between the two facet sections, and a depth of the intermediate section is greater than a respective depth of the two facet sections.

13. The method according to claim 12, wherein the bonding material provided with a cover layer comprising gold is arranged at the one of the top side and the underside, forming the barrier comprises applying $SiO_2$ on the one of the top side and the underside such that the one of the top side and the underside including the cover layer is completely covered with $SiO_2$, and after the covering $SiO_2$ is selectively removed from the cover layer such that the barrier is formed at least partly by the remaining $SiO_2$.

14. A method of producing an optoelectronic lighting device, comprising:
providing an optoelectronic semiconductor chip comprising a top side and an underside opposite the top side, wherein a semiconductor layer sequence is formed between the top side and the underside, and the semiconductor layer sequence comprises an active zone that generates electromagnetic radiation, and
forming at one of the top side and the underside a barrier for a bonding material flowing on account of cohesive bonding of the semiconductor chip to a carrier,
wherein a plurality of optoelectronic semiconductor chips configured as lasers and forming a laser bar are provided, and wherein the undersides of the semiconductor chips form a common underside of the laser bar.

15. The method according to claim 14, wherein forming the barrier comprises forming one or a plurality of walls such that a plurality of at least partly laterally closed troughs that receive the flowing bonding material is formed by the one or the plurality of walls and the underside, and the plurality of troughs are formed at the common underside of the laser bar, in each case one or a plurality of lasers being arranged within said troughs.

16. The method according to claim 14, wherein the bonding material provided with a cover layer comprising gold is arranged at the one of the top side and the underside, forming the barrier comprises applying $SiO_2$ on the one of the top side and the underside such that the one of the top side and the underside including the cover layer is completely covered with $SiO_2$, and after the covering $SiO_2$ is selectively removed from the cover layer such that the barrier is formed at least partly by the remaining $SiO_2$.

17. A method of producing an optoelectronic lighting device, comprising:
providing an optoelectronic semiconductor chip comprising a top side and an underside opposite the top side, wherein a semiconductor layer sequence is formed between the top side and the underside, and the semiconductor layer sequence comprises an active zone that generates electromagnetic radiation, and
forming at one of the top side and the underside a barrier for a bonding material flowing on account of cohesive bonding of the semiconductor chip to a carrier, wherein the bonding material provided with a cover layer comprising gold is arranged at the one of the top side and the underside, forming the barrier comprises applying $SiO_2$ on the one of the top side and the underside such that the one of the top side and the underside including the cover layer is completely covered with $SiO_2$, and after the covering $SiO_2$ is selectively removed from the cover layer such that the barrier is formed at least partly by the remaining $SiO_2$.

* * * * *